(12) United States Patent
Jung

(10) Patent No.: US 9,245,967 B2
(45) Date of Patent: *Jan. 26, 2016

(54) SEMICONDUCTOR DEVICE INCLUDING METAL SILICIDE LAYER AND METHOD FOR MANUFACTURING THE SAME

(71) Applicant: SAMSUNG ELECTRONICS CO., LTD., Suwon-Si, Gyeonggi-Do (KR)

(72) Inventor: Jong-Ki Jung, Hwaseong-si (KR)

(73) Assignee: SAMSUNG ELECTRONICS CO., LTD., Yongin, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/518,581

(22) Filed: Oct. 20, 2014

(65) Prior Publication Data

US 2015/0035057 A1 Feb. 5, 2015

Related U.S. Application Data

(63) Continuation of application No. 13/611,783, filed on Sep. 12, 2012, now Pat. No. 8,890,163, which is a continuation of application No. 12/769,314, filed on Apr. 28, 2010, now Pat. No. 8,304,819.

(30) Foreign Application Priority Data

Oct. 14, 2009 (KR) .................. 10-2009-0097746

(51) Int. Cl.
*H01L 21/02* (2006.01)
*H01L 29/45* (2006.01)
(Continued)

(52) U.S. Cl.
CPC .......... *H01L 29/458* (2013.01); *H01L 21/2855* (2013.01); *H01L 21/28512* (2013.01);
(Continued)

(58) Field of Classification Search
CPC .................. H01L 2924/0002; H01L 2924/00; H01L 21/28512; H01L 21/28518; H01L 21/2855; H01L 21/28556; H01L 21/74; H01L 21/76805; H01L 21/76834; H01L 21/76843; H01L 29/41758; H01L 29/458; H01L 29/6656; H01L 29/6659; H01L 29/7833; H01L 29/7843
USPC ......... 257/181, 217, 343–344, 382–383, 576, 257/66; 438/197
See application file for complete search history.

(56) References Cited

U.S. PATENT DOCUMENTS 5,900,290 A 5/1999 Yang et al.
6,087,209 A 7/2000 Yeap et al.
(Continued)

FOREIGN PATENT DOCUMENTS

CN 101283447 10/2008
JP 07-254574 10/1995
(Continued)

OTHER PUBLICATIONS

B.C. Johnson et al., "Dopant-Enchanced Solid-Phase Epitaxy in Buried Amorphous Silicon Layers," Physical Review B 76, 045216 (2007) pp. 045216-1_045216-12.
(Continued)

*Primary Examiner* — Mohammed Shamsuzzaman
(74) *Attorney, Agent, or Firm* — F. Chau & Associates, LLC

(57) ABSTRACT

A device formed from a method of fabricating a fine metal silicide layer having a uniform thickness regardless of substrate doping. A planar vacancy is created by the separation of an amorphousized surface layer of a silicon substrate from an insulating layer, a metal source enters the vacancy through a contact hole through the insulating later connecting with the vacancy, and a heat treatment converts the metal in the vacancy into metal silicide. The separation is induced by converting the amorphous silicon into crystalline silicon.

9 Claims, 32 Drawing Sheets

(51) Int. Cl.
  *H01L 21/285* (2006.01)
  *H01L 21/74* (2006.01)
  *H01L 21/768* (2006.01)
  *H01L 29/78* (2006.01)
  *H01L 29/417* (2006.01)
  *H01L 29/66* (2006.01)

(52) U.S. Cl.
  CPC .... *H01L21/28518* (2013.01); *H01L 21/28556* (2013.01); *H01L 21/74* (2013.01); *H01L 21/76805* (2013.01); *H01L 21/76834* (2013.01); *H01L 21/76843* (2013.01); *H01L 29/41758* (2013.01); *H01L 29/7833* (2013.01); *H01L 29/7843* (2013.01); *H01L 29/6656* (2013.01); *H01L 29/6659* (2013.01); *H01L 2924/0002* (2013.01)

(56) References Cited

U.S. PATENT DOCUMENTS

| | | | |
|---|---|---|---|
| 6,093,243 A * | 7/2000 | Okada et al. | 117/8 |
| 6,313,036 B1 | 11/2001 | Oda | |
| 6,440,828 B1 * | 8/2002 | Sato et al. | 438/533 |
| 6,630,721 B1 | 10/2003 | Ligon | |
| 6,812,082 B2 | 11/2004 | Hirakata et al. | |
| 7,057,230 B2 | 6/2006 | Tanaka et al. | |
| 7,122,449 B2 | 10/2006 | Langdo et al. | |
| 7,223,646 B2 | 5/2007 | Miyashita et al. | |
| 7,259,110 B2 | 8/2007 | Ohnuma et al. | |
| 7,358,551 B2 | 4/2008 | Chidambarrao et al. | |
| 7,414,283 B2 | 8/2008 | Tanaka et al. | |
| 7,700,992 B2 | 4/2010 | Tanaka et al. | |
| 7,709,317 B2 | 5/2010 | Yang et al. | |
| 7,736,964 B2 | 6/2010 | Yamamoto et al. | |
| 7,755,114 B2 | 7/2010 | Tsuchiaki | |
| 7,785,947 B2 | 8/2010 | Isobe et al. | |
| 7,936,016 B2 * | 5/2011 | Tsutsumi et al. | 257/344 |
| 8,017,986 B2 | 9/2011 | Tanaka et al. | |
| 8,367,542 B2 * | 2/2013 | Hatanaka et al. | 438/639 |
| 8,426,904 B2 | 4/2013 | Tanaka et al. | |
| 8,698,224 B2 | 4/2014 | Tanaka et al. | |
| 2001/0035558 A1 | 11/2001 | Smith et al. | |
| 2004/0142519 A1 | 7/2004 | Lee | |
| 2005/0124128 A1 * | 6/2005 | Kim | 438/305 |
| 2007/0080397 A1 * | 4/2007 | Manabe | 257/335 |
| 2007/0099404 A1 | 5/2007 | Govindaraju et al. | |
| 2008/0029831 A1 * | 2/2008 | Chen et al. | 257/408 |
| 2008/0128827 A1 | 6/2008 | Ohta | |
| 2008/0171411 A1 | 7/2008 | Takata et al. | |
| 2008/0272357 A1 | 11/2008 | Horii et al. | |
| 2008/0303068 A1 | 12/2008 | Grill et al. | |
| 2010/0025771 A1 * | 2/2010 | Hoentschel et al. | 257/369 |
| 2010/0075474 A1 | 3/2010 | Kudou et al. | |
| 2010/0078728 A1 * | 4/2010 | Li et al. | 257/369 |
| 2010/0187636 A1 | 7/2010 | Yang et al. | |
| 2012/0235244 A1 * | 9/2012 | Yin et al. | 257/368 |
| 2013/0009217 A1 * | 1/2013 | Yin et al. | 257/288 |

FOREIGN PATENT DOCUMENTS

| | | |
|---|---|---|
| JP | 09-102469 | 4/1997 |
| JP | 10-209078 | 8/1998 |
| JP | 11-214688 | 8/1999 |
| JP | 2001156270 | 6/2001 |
| JP | 2003-077859 | 3/2003 |
| JP | 2005-086179 | 3/2005 |
| JP | 2006-114651 | 4/2006 |
| JP | 2006-278974 | 10/2006 |
| JP | 2008-159650 | 7/2008 |
| KR | 10-0250687 | 1/2000 |
| KR | 10-2004-0054139 | 6/2004 |
| KR | 10-2004-0061294 | 7/2004 |
| KR | 10-2005-0055361 | 6/2005 |
| KR | 1020060016269 | 2/2008 |
| WO | 03-012878 | 2/2003 |

OTHER PUBLICATIONS

Tiawanese Office Action Dated Mar. 3, 2015.
Korean Office Action Dated Nov. 11, 2015.

* cited by examiner

1

SEMICONDUCTOR DEVICE INCLUDING METAL SILICIDE LAYER AND METHOD FOR MANUFACTURING THE SAME

CROSS-REFERENCE TO RELATED APPLICATIONS

This U.S. non-provisional patent application is a continuation application of co-pending U.S. application Ser. No. 13/611,783 filed Sep. 12, 2012, which is a continuation application of U.S. application Ser. No. 12/769,314 filed Apr. 28, 2010, which claims priority under 35 U.S.C. §119, of Korean Patent Application No. 10-2009-0097746, filed on Oct. 14, 2009, the disclosures of which are each hereby incorporated by reference herein in their entireties.

BACKGROUND

1. Field of the Inventive Concept

The present inventive concept relates to a semiconductor device including a metal silicide layer of uniform thickness and method for manufacturing the same.

2. Description of the Related Art

Integrated circuits formed on semiconductor materials implement microelectronic devices that are widely used in the design of digital logic circuits such as microprocessors and memory devices for products ranging from satellites to consumer electronics. Advances in semiconductor chip fabrication technology, including technology development and process improvement obtained through scaling for high speed and high integration density, have raised the performance of digital logic systems.

A semiconductor device including a formed silicide layer can be a field effect transistor (FET) which has a source region and a drain region. Field-effect transistors (FET) and other related insulated-gate electronic devices are main components of CMOS (complementary metal oxide circuits) integrated circuits. A MOSFET generally consists of two closely spaced, doped regions (the "source" and the "drain") formed in a semiconductor substrate. The region between the two is the "channel." A thin insulation layer is formed directly above the channel. A conductive material called the gate electrode is positioned directly over and completely covering the gate insulation layer directly above the channel. A voltage applied to the gate electrode affects the conductive properties of the channel region, whereby the FET is turned ON or OFF. A conductive material may be applied to the top surface of each of the "source" and the "drain" regions to provide electrical contacts (electrodes) which may be accessed through a contact hole. Manufacturers of integrated circuits typically form metal-silicide contacts, electrodes and interconnections between circuit components. See e.g., U.S. Pat. No. 4,337,476 (Fraser and Murarka).

According to a conventional method of forming a semiconductor device illustrated in U.S. Pat. No. 6,440,828 and US Patent Application 2005-0124128, an interlayer dielectric layer (ILD) is formed on the doped source and drain regions of the silicon layer, and then vertical openings are excavated through the interlayer dielectric layer to expose a portion of each source and drain region of silicon layer. Then the S/D regions exposed through the contact holes may then be amorphized by an ion implantation. Then a barrier metal layer is formed along the sidewalls of the contact hole and on the exposed S/D region. Then a silicide layer (55) is formed on the S/D region at the bottom of the contact hole by an additional heat-treatment. Then a conductive plug is formed in each vertical opening.

According to another conventional method of forming a semiconductor device, a silicide layer is formed on the S/D region firstly, and then, an interlayer dielectric layer is formed on the silicide layer, and then a vertical opening is excavated through the interlayer dielectric layer to expose the silicide layer, and then a conductive plug is formed in the vertical opening.

In order to form a low-resistivity contact with a semiconductor (substrate) in a contact hole, a refractory metal film is deposited so as to cover the contact area of the "source" and the "drain" regions of the semiconductor substrate. The next step is a heat-treatment during which the refractory metal reacts with the semiconductor material so as to produce a refractory metal silicide layer. Titanium is attractive, because the resulting titanium silicide ($TiSi_2$) forms a low Schottky barrier with any one of the p-type semiconductors and the n-type semiconductors. Moreover, the titanium easily reduces natural oxide unavoidably covering the contact area.

The aspect ratio (height/width) of contact holes is getting larger and larger as the integration density increases. It is difficult, if not impossible, to properly deposit refractory metal on the bottom surface of a miniature contact hole having a large aspect ratio through a metal sputtering technique.

Semiconductor Device manufacturers attempt to use a chemical vapor deposition (CVD) so as to grow a refractory metal layer or a refractory metal silicide layer over the exposed semiconductor surface, especially in the miniature contact holes having the large aspect ratio. However, the refractory metal grows differently on the semiconductor surface depending upon the conductivity (dopant) type of the contact area. When the refractory metal is concurrently deposited on a heavily doped p-type contact area and a heavily doped n-type contact area, the refractory metal layer on the heavily doped p-type contact area can become different in thickness from the heavily doped n-type contact area. If one of the refractory metal layers is optimized, the other refractory metal layer is rendered thinner. On the other hand, if the other refractory metal layer is optimized, the refractory metal layer is too thick, and material is wasted and leakage current may be increased.

Currently, millions of FETs including silicide contacts are formed and interconnected in each semiconductor chip to construct microprocessors (CPUs), and nonvolatile memory circuits such as static random access memories (SRAM) and static random access memories (DRAM). Special FETs are used as memory cell transistors to store data in nonvolatile memory devices such as NAND flash memory devices and NOR flash memories. Each of the memory cell transistors stores 1-bit data or data of two or more bits. A nonvolatile memory cell FET capable of storing 1-bit data is called a single level cell (SLC). A nonvolatile memory cell FET capable of storing data of two or more bits is called a multi level cell (MLC).

SUMMARY OF THE INVENTIVE CONCEPT

An aspect of the inventive concept provides a method of fabricating a fine metal silicide layer having a uniform thickness regardless of substrate doping. Another aspect of the inventive concept provides a method of fabricating a semiconductor device (e.g., field effect transistor) including a metal silicide layer, using fewer steps and thus increasing manufacturing efficiency and reducing manufacturing time and cost. Other aspects of the inventive concept provide memory chips and memory modules, CMOS imaging chips, nonvolatile memory cards, solid state drives (SSDs) and computing systems including a fine metal silicide layer formed on a silicon substrate.

Various embodiments of the inventive concept provide methods of fabricating a semiconductor device (e.g., field effect transistor, FET) including a fine metal silicide layer (e.g., having a uniform thickness of from about 1 Å to 100 Å), using less material, fewer steps.

An aspect of the inventive concept provides a method for forming a fine silicide layer having a controlled uniform thickness selectable based upon a device size, regardless of the doping type of the underlying silicon substrate. Methods according to various embodiments of the inventive concept obviate at least one conventional step (for example, at least one heat treatment step) for forming a metal silicide layer, by multipurposing a heat treatment conventionally used for forming the barrier metal layer of a conductive plug to react the metal to form the metal silicide layer. In accordance with various embodiments of the inventive concept, precise control of the uniform thickness of the metal silicide layer is provided regardless of the doping type of the substrate upon which the metal silicide layer is formed.

A method of fabricating a semiconductor device on a silicon substrate, comprising the steps of: forming an insulating layer directly on a first region of a silicon substrate and over a second region of the silicon substrate adjacent to the first region; forming a first vacancy in the first region between the insulating layer and the silicon substrate, wherein the first vacancy has a height of TH1; forming a first hole through the said insulating layer wherein the hole connects with the first vacancy; depositing metal into the first vacancy through the first hole; and applying a second heat treatment to the metal deposited in the first vacancy. The silicon in the first region of the silicon substrate reacts with the deposited metal during the second heat treatment to form a fine metal-silicide layer on the silicon substrate in the first region within the space of the vacancy. The vacancy and the resulting metal silicide are typically planar and have a uniform thickness.

Another aspect of the inventive concept provides a method of fabricating a metal-silicide layer on a silicon substrate, comprising the steps of: amorphousizing a surface layer of a silicon substrate within a first region; forming an insulating layer directly on the amorphousized silicon layer in the first region and over a second region of the substrate adjacent to the first region; crystallizing the amorphous silicon layer in said first region to form a first vacancy in the first region between the insulating layer and the silicon substrate; and excavating a first hole through the said insulating layer wherein the hole connects with to the first vacancy; and then depositing metal into the first vacancy through the first hole; and applying a second heat treatment to the metal deposited in the first vacancy.

Another aspect of the inventive concept provides a method of fabricating a semiconductor device (e.g., a field effect transistor, FET) including a fine metal silicide layer.

Another aspect of the inventive concept provides an apparatus comprising a field effect transistor (FET) including a fine metal silicide layer having a uniform thickness of from about 1 Å to 100 Å.

Various other aspects of the inventive concept provide a microprocessor, a field effect transistor, a volatile memory device, nonvolatile memory (NVM) device, or a CMOS imaging circuit, including a fine metal silicide layer formed on a silicon substrate.

Another aspect of the inventive concept provides an apparatus comprising a fine metal silicide layer having a uniform thickness of from about 1 Å to 100 Å formed on a silicon substrate. The apparatus can be a computing system that further comprises: a central processing unit (CPU) connected to a system bus; a data storage device connected to the system bus and including the nonvolatile memory (NVM) device and the memory controller. The computing system can be a personal computer, a network file server, a cellular phone, a personal digital assistant (PDAs), a digital cameras, a camcorder, a portable audio player, or a portable media player.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component region, layer or section from another region, layer or section. Thus, a first element, component, region, layer or section discussed below could be termed a second element component, region, layer or section without departing from the teachings of exemplary embodiments.

Spatially relative terms, e.g., "beneath," "below," "lower," "above," "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected in practice. Thus, exemplary embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

BRIEF DESCRIPTION OF THE DRAWINGS

Hereinafter, exemplary embodiments of the inventive concept will be described below in more detail with reference to the accompanying drawings. The inventive concept may, however, be embodied in different forms and should not be construed as limited to the exemplary embodiments set forth herein. Rather, these embodiments are provided so that this disclosure will be thorough and complete, and will fully convey the scope of the inventive concept to those skilled in the art.

FIG. 15b is a plan view of a core/peripheral region of the DRAM device of FIG. 15a;

FIG. 17b is a cross sectional view of FETs including a metal silicide layer fabricated according to any embodiment of the present inventive concept formed in a peripheral logic region 3150 of the CMOS image sensor 3100 of FIG. 17a;

DETAILED DESCRIPTION OF EXEMPLARY EMBODIMENTS

FIGS. 1a to 1f are cross sectional views showing a fabrication method of a semiconductor device including a metal silicide layer 180 and conductive plug 170A, according to a first exemplary embodiment of the inventive concept.

Figure 1A:
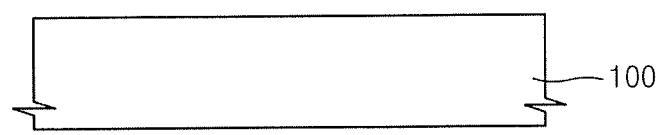
FIGS. 1a to 1f are cross sectional views showing a fabrication method of a semiconductor device according to an exemplary embodiment of the inventive concept.

Referring to FIG. 1a, a silicon substrate 100, for example, a conventional single crystal silicon substrate of a first conduction type, is provided. In alternative embodiments, a semiconductor substrate 100 may be an epitaxial growth silicon layer formed on a non-semiconductor substrate (e.g., silicon on insulator, SOI). The first conduction type may be a p-type or n-type. For convenience of illustration, this disclosure illustrates an example process of using a p-type semiconductor substrate 100. Device isolation (e.g., trench isolation, e.g., shallow trench isolation, STI, e.g., 1010 shown in FIG. 15c) are formed buried in the silicon substrate 100 to define at least one active region in the semiconductor substrate 100. In various embodiments of the inventive concept, the portion of the silicon substrate 100 shown in the cross sectional views of FIGS. 1a to 1f are within an active region in the silicon substrate 100.

Figure 1B:
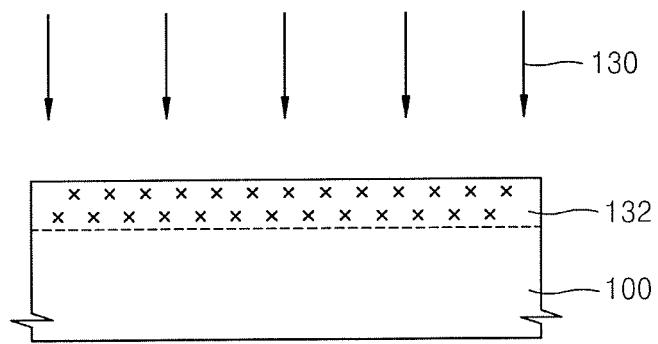

Referring to FIG. 1b, a layer 132 of the exposed surface of the silicon layer 100 is transformed into an amorphous silicon layer 132 by exposing the substrate 100 to a plasma gas 130, for example, $C_xF_y$ (wherein x and y are integers ranging from 1 to 10, preferably $C_3F_6$, $C_4F_6$, $C_4F_8$, and $C_5F_8$) and/or $O_2$ and/or Ar. To form the amorphous silicon layer 132, the silicon layer 100 is placed in a reaction chamber of a plasma apparatus having a bias power of about 1000 watts or less, and the plasma gas 130 is supplied into the chamber.

Figure 1C:
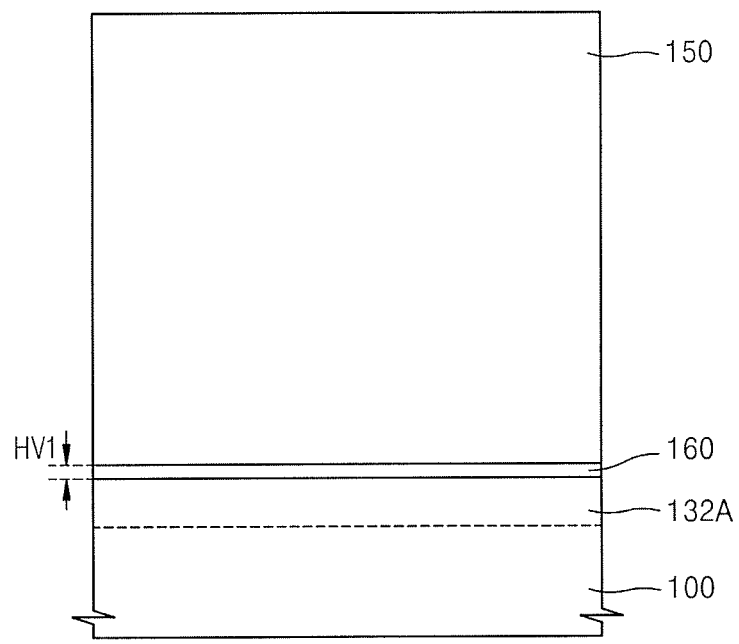

Referring to FIG. 1c, a first insulating layer 150 is formed on the silicon substrate 100. The first insulating layer material 150 covers the active region shown in FIG. 1c, and also extends beyond the active region shown in FIG. 1c. The first insulating layer 150 may extend to cover an adjacent isolation region (e.g., trench isolation, e.g., STI, not shown in FIG. 1c but see FIG. 15c) which overlap will provide a foundation to support the first insulating layer 150 over the silicon substrate 100. The interface between the crystallized silicon layer 132A and the first insulating layer 150 may have different properties (e.g., different adhesion properties) than the interface between the adjacent isolation region (not shown in FIG. 1c but see FIG. 15c) and the first insulating layer 150.

The first insulating layer 150 may comprise a plurality of interlayer dielectric layer (e.g., 150-1, 150-2, 150-3, 150-4, 150-5 etc.) and a plurality of stress control layers 150-6.

The first insulating layer 150 may be formed and may comprise an insulating layer consisting of a polysilazane type inorganic SOG (spin on glass) such as TOSZ (TOnen SilaZene), or a photoresist layer, or an oxide such as BPSG, USG, FOX, TEOS, HDP-CVD, or a combination of an oxide and a nitride.

The first insulation layer 150 may be formed on the amorphous silicon layer 132 by a spin coating method. The first insulation layer 150 may comprise an insulating layer consisting of silicon oxide such as borophosphosilicate glass (BPSG), phosphosilicate glass (PSG), undoped silicate glass (USG), spin-on glass (SOG), flowable oxide (FOx), tetraethyl orthosilicate (TEOS), plasma-enhanced tetraethyl orthosilicate (PE-TEOS), high-density plasma chemical vapor deposition (HDP-CVD) oxide, etc. The first insulation layer may be formed by a chemical vapor deposition (CVD) process, a low-pressure chemical vapor deposition (LPCVD) process, a plasma-enhanced chemical vapor deposition (PECVD) process, an high-density plasma chemical vapor deposition (HDP-CVD) process, etc. The first insulation layer may be planarized by a chemical mechanical polishing (CMP) process.

A first heat treatment is conventionally needed to cure the first insulating layer material to form the first insulating layer 150. The first heat treatment applied may be at a high temperature of about 600° C. to 800° C. While the heat treatment is being applied at the high temperature 600° C. to 800° C. for forming the first insulating layer 150, the amorphous silicon layer 132 is crystallized to form a crystallized silicon layer 132A.

Due to a volume shrinking of the crystallized silicon layer 132A during the crystallization of the amorphous silicon layer 132, while the adjacent isolation region does not shrink, a horizontal (planar) vacancy 160 is formed over the active region shown in FIG. 1c due to separation and suspension of the first insulation layer 150 over the active region shown in FIG. 1c. The vacancy 160 formed along the interface between the crystallized silicon layer 132A and the first insulating layer 150 has a uniform height HV1 of from about 1 Å to 100 Å

Figure 1D:
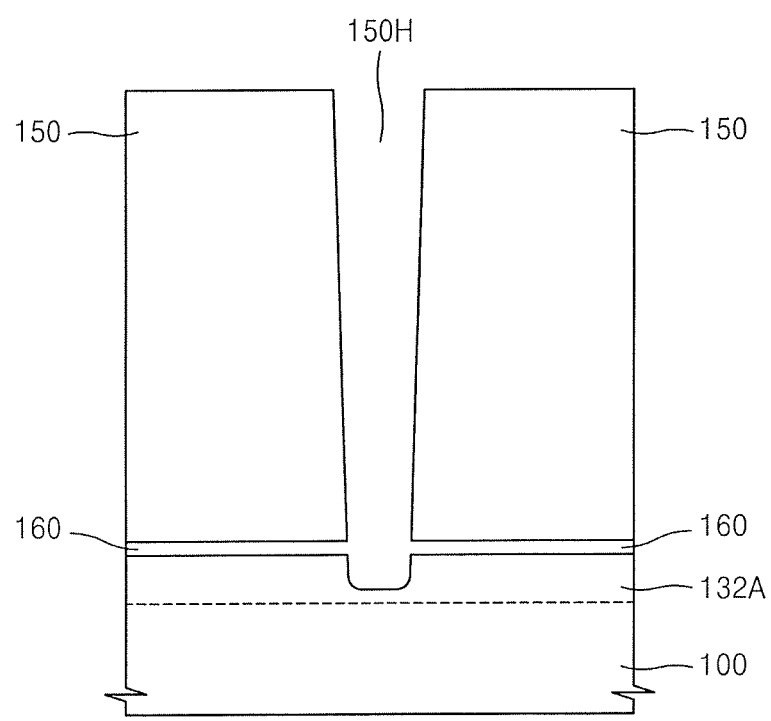

Referring to FIG. 1d, an etching process is performed to remove a portion of the first insulation layer 150 and form a vertical opening, contact hole 150H through the first insulating layer 150 over the active region shown in FIG. 1 c, connecting with the vacancy 160. The vertical opening 150H may be a hole type or a line type. The contact hole 150H exposes the substrate 100. A portion of the crystallized silicon layer 132A of the substrate 100 at the bottom of the contact hole 150H may or may not be removed while removing the portion of the first insulating layer 150 to form contact hole 150H.

Referring to FIG. 1 e, a metal-containing layer 170 is formed in the contact hole 150H and on the first insulating layer 150 using PVD, CVD, or ALD. The metal-containing layer 170 forms a conductive plug (170A shown in FIG. 10 in the contact hole 150H. The material from which the metal-containing layer 170 is formed also fills the vacancy 160. The metal-containing layer 170 comprises a barrier metal layer 172 such as titanium (Ti), titanium nitride (TiN), titanium tungsten (TiW), titanium/titanium nitride, cobalt (Co), nickel (Ni), hafnium (Hi), platinum (Pt), tungsten (W), titanium tungsten (TiW), titanium/titanium nitride, tantalum (Ta), tantalum nitride (TaN), etc. and combinations thereof, and a conductive metal layer 174 such as W etcetera. In this embodiment, the barrier metal layer 172 and the metal silicide layer 180 are formed at almost the same time and the metal silicide layer 180 has the same component material, for example Ti, as the barrier metal layer 172.

When using atomic layer deposition (ALD) or chemical vapor deposition (CVD) to form the barrier metal layer 172 consisting of Ti/TiN, $TiCl_4$ gas used as a Titanium source gas is supplied in the vertical opening 150H and a portion of the $TiCl_4$ forms the barrier metal layer 172, and the other portion of the $TiCl_4$ flows into the horizontal (planar) vacancy 160.

The $TiCl_4$ gas reacts with the crystallized silicon layer 132A at a temperature of about 400° C. to 800° C. which is the same process temperature for forming the barrier metal layer 172. The reaction of the $TiCl_4$ gas with the crystallized silicon layer 132A forms the metal silicide layer 180, for example, $TiSi_2$.

To form the Ti/TiN using the physical vapor deposition (PVD) method, a Ti target can be used to form the Ti/TiN barrier metal layer 172. During the PVD a portion of the Ti particles separated from the Ti target by sputtering form the barrier metal layer 172 and the other portion of the Ti particles flows into the horizontal (planar) vacancy 160. The Ti particles in the horizontal (planar) vacancy 160 react with the crystallized silicon layer 132A at a temperature of about 400° C. to 800° C., which is the same process temperature for forming the barrier metal layer 172, to form the (TiSi2) metal silicide layer 180.

Thus, material forming the barrier metal layer 172 of the metal-containing layer 170 that flowed into the horizontal (planar) vacancy 160 combines with the surface of the crystallized silicon layer 132A under the first insulating layer 150 to form a metal silicide layer 180 having a thickness of from about 5 Å to 100 Å. For example, in case of using Ti/TiN as the barrier metal layer 172, the resulting metal silicide layer 180 is comprised of titanium silicide ($TiSi_2$). The thickness of the resulting metal silicide layer 180 is limited and controlled by the height HV1 of from about 1 Å to 100 Å of the horizontal (planar) vacancy 160.

In various alternative embodiments of the inventive concept, the metal-containing layer 170 may consist of only one single metal such as one of Ti, TiN, Co, Ni, Hf, Pt, or W etcetera. In that case, the single metal layer reacts with the crystallized silicon layer 132A under the first insulating layer 150 to form the metal silicide layer 180. Thus, a metal-silicide layer is formed from the crystallized silicon layer 132A under and adjacent to the bottom portion of the vertical opening 150H.

Figure 1E:
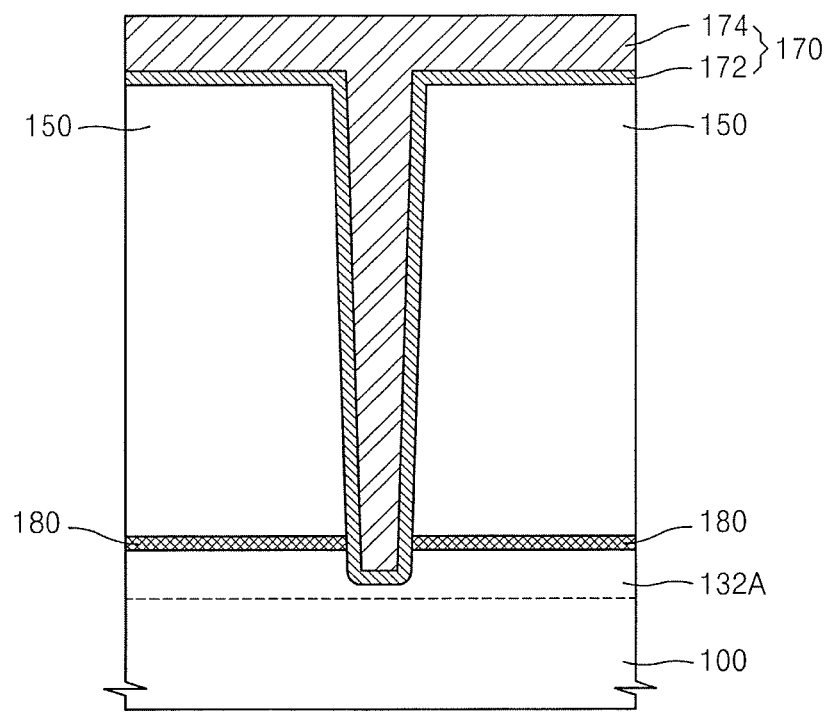
Figure 1F:
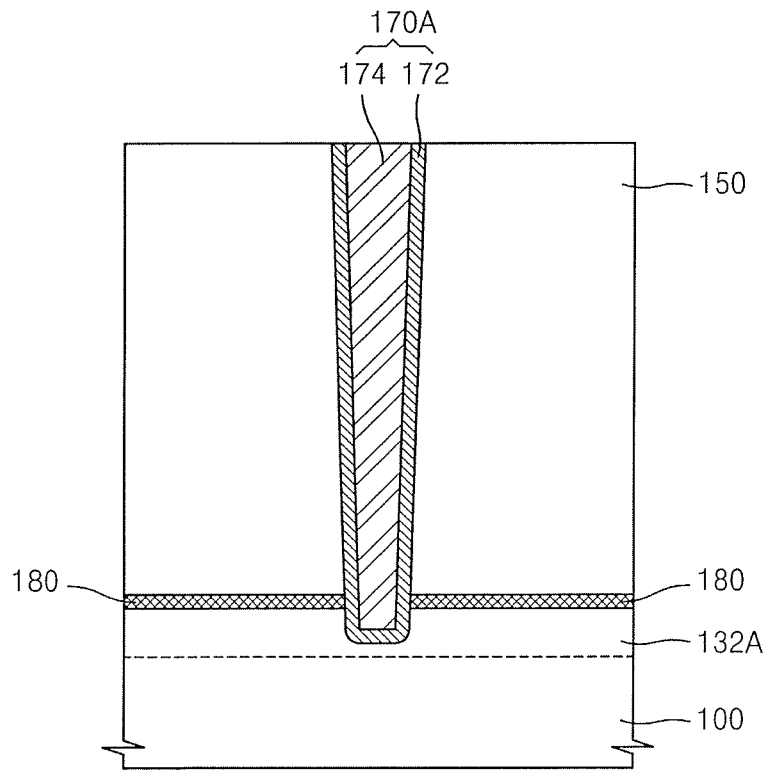

Referring to FIG. 1f, a removal process is performed on the metal layer until a conductive plug 170A is formed by removing the planar residue of the metal-containing layer 170 formed on the first insulating layer 150 beyond the contact hole 150H. The planar residue of the metal-containing layer 170 can be removed using a planarization process such as CMP (chemical vapor deposition) or an etch back until the top surface of the first insulating layer 150 is again exposed.

A polysilicon layer is then deposited on the insulating layer. Some part of the insulating layer and the polysilicon layer is removed by a photolithography process to form a gate electrode 15 of polysilicon and a gate insulating layer 13 on the active region of the semiconductor substrate 100.

Figure 15A:
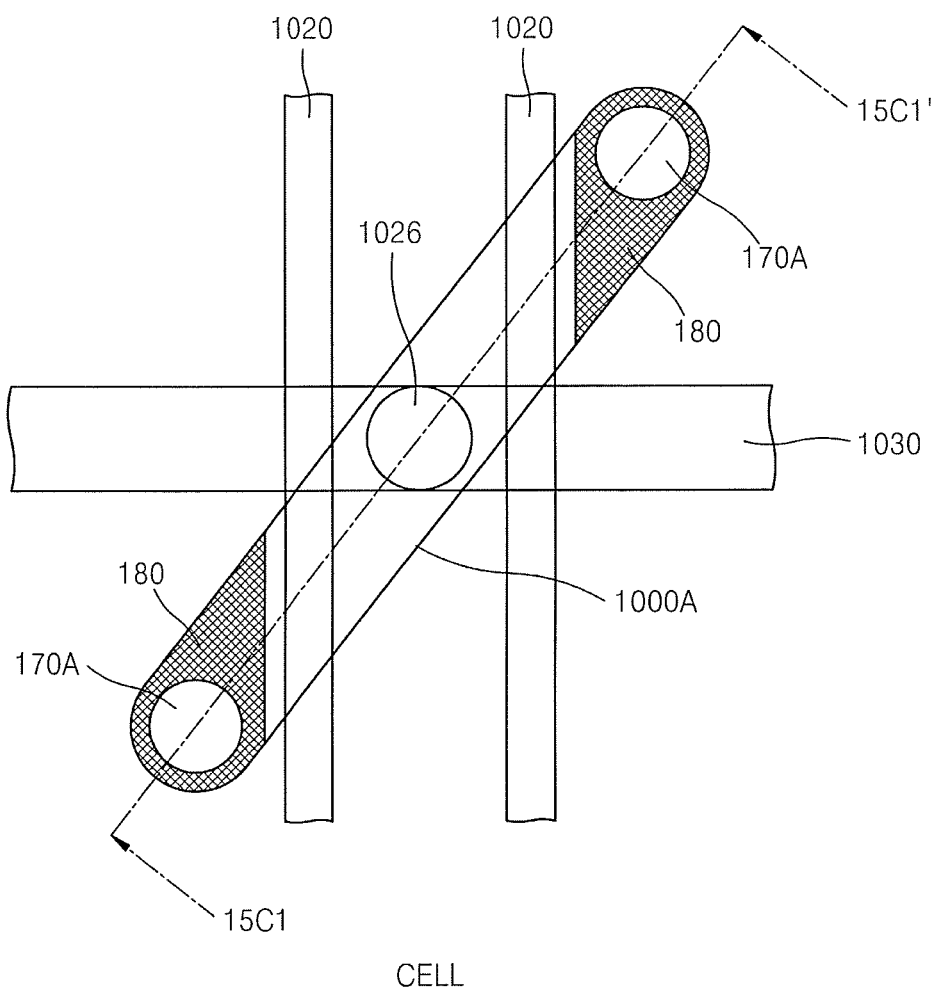
FIG. 15a is a plan view of a memory cell region of DRAM device according to an exemplary embodiment of the inventive concept.
Figure 15B:
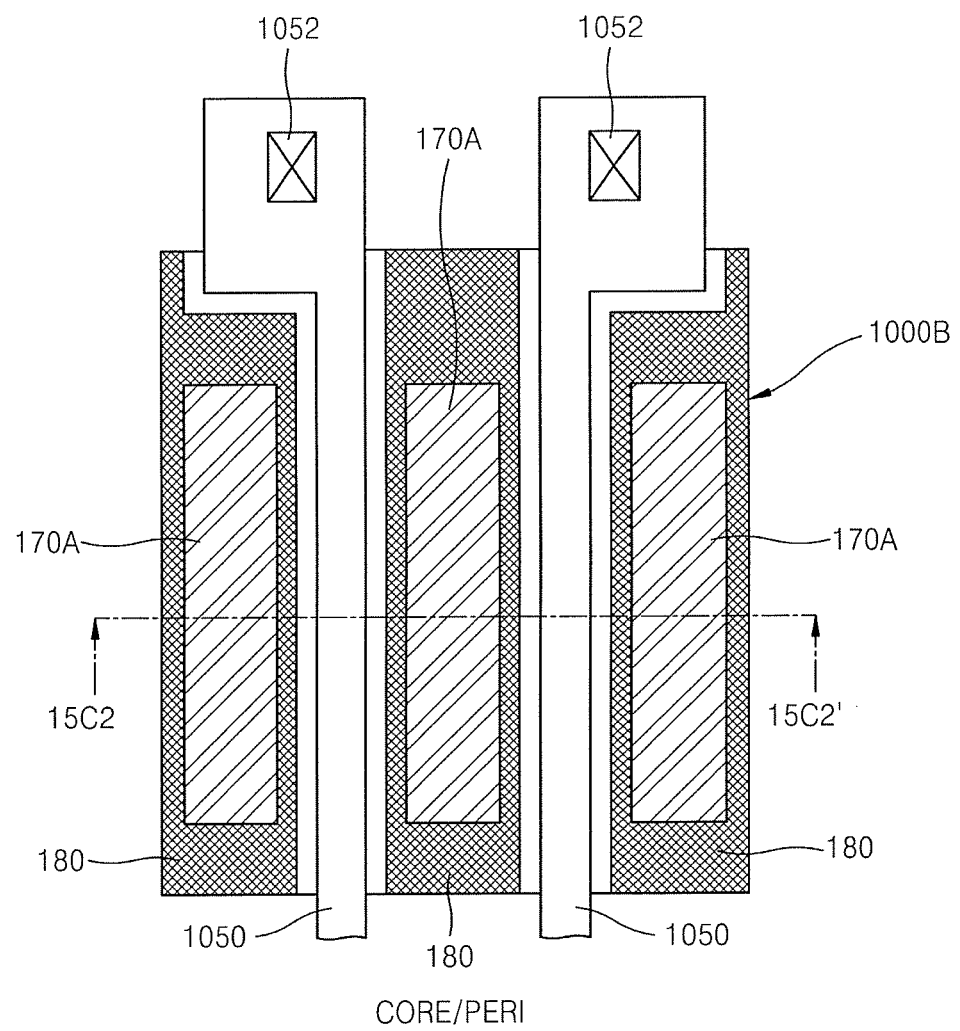
Figure 15C:
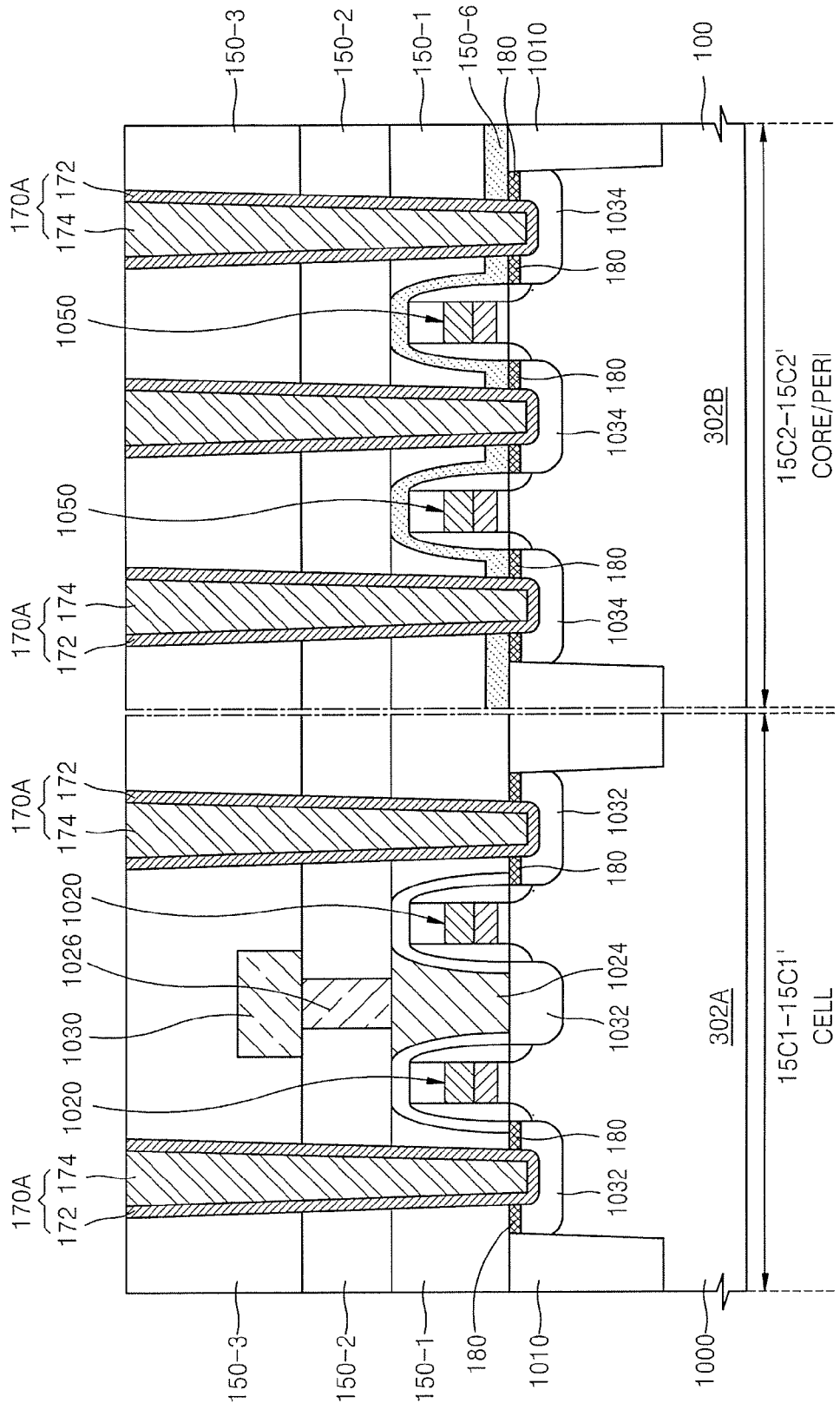
FIG. 15c is a cross sectional view along section line 15C1-15C1' of FIG. 15a and section line 15C2-15C2' in FIG. 15b.

FIG. 15c shows cross sectional views of a memory cell region of DRAM and of a core/peripheral region of the DRAM including the metal-silicide layer 180 formed according to an embodiment of the inventive concept (e.g., by the method of FIGS. 1a to 1f). Referring to FIG. 15c section line 15C1-15C1' is a cross section of a memory cell region in a DRAM device shown in FIG. 15a. Referring to FIG. 15c section line 15C2-15C2' is a cross section of the core/peripheral region of the DRAM device in FIG. 15b.

In the memory cell region, the contact plug 170A and a metal silicide layer 180 make electrical contact with the S/D region 1032 of memory cell transistors 1020. In the core/peripheral region, a contact plug 170A and a metal silicide layer 180 are formed on the S/D region 1034 of the gate electrode of a low voltage (LV) transistor 1050 and/or a high voltage (HV) transistor 1050. The metal silicide layer 180 is formed surrounding the contact plug 170A on the S/D regions of each transistor. The first insulating layer 150 shown in FIGS. 1a to 1f corresponds to interlayer dielectric layers 150-1, 150-2, 150-3, and in the cell region only, stress control layer 150-6, shown in FIG. 15c. As shown in FIG. 15c, the first insulating layer 150 (150-1, 150-2, 150-3, and 150-6) is formed over the S/D regions of transistors (1032, 1034) and beyond the S/D regions of transistors (1032, 1034). As shown in FIG. 15c the first insulating layer 150 (150-1, 150-2, 150-3, and 150-6) extends over the gate regions of transistors (1032, 1034) and over the trench isolations 1010 that surround active regions (302A, 302B) of the silicon substrate 100.

Figure 2A:
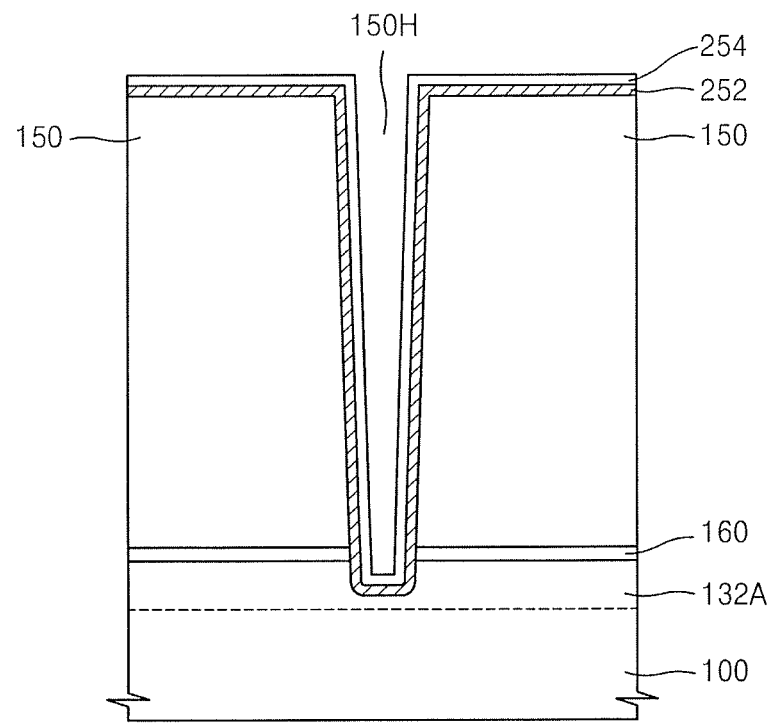
FIGS. 2a to 2e are cross sectional views showing a fabrication method of the semiconductor device including a conductive plug 170A shown in FIG. 2e, according to an exemplary embodiment of the inventive concept.
Figure 2B:
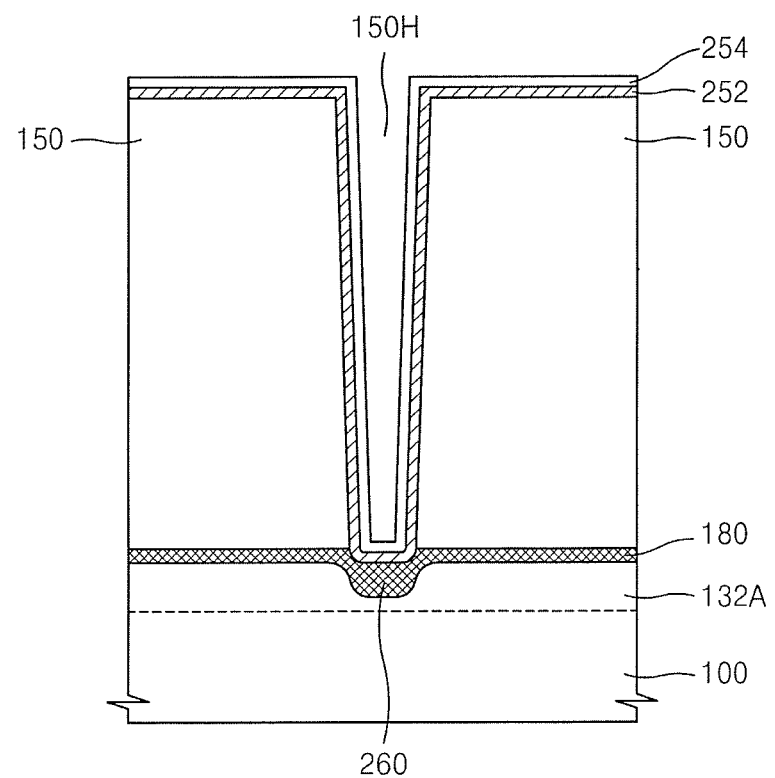
Figure 2C:
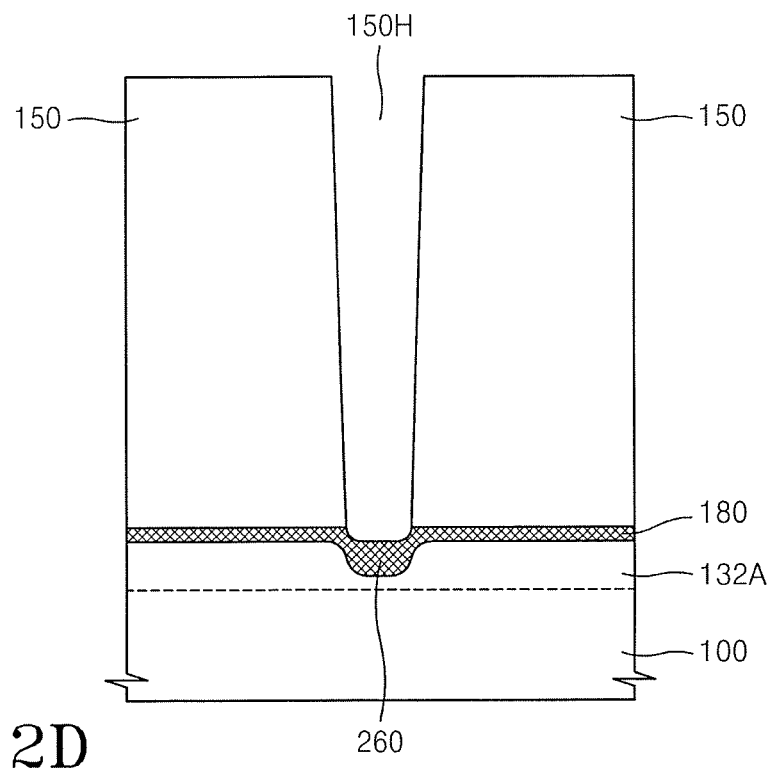
Figure 2D:
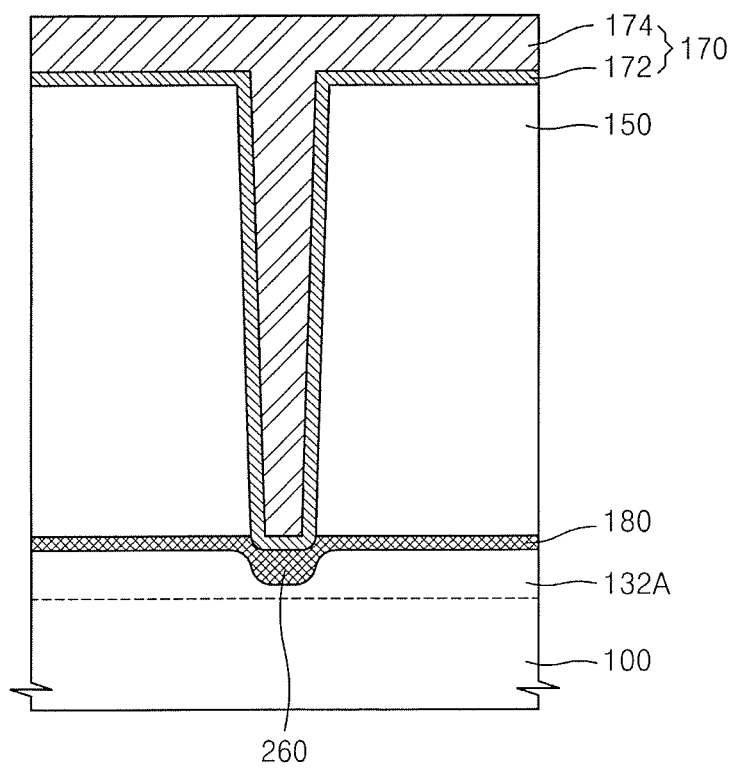
Figure 2E:
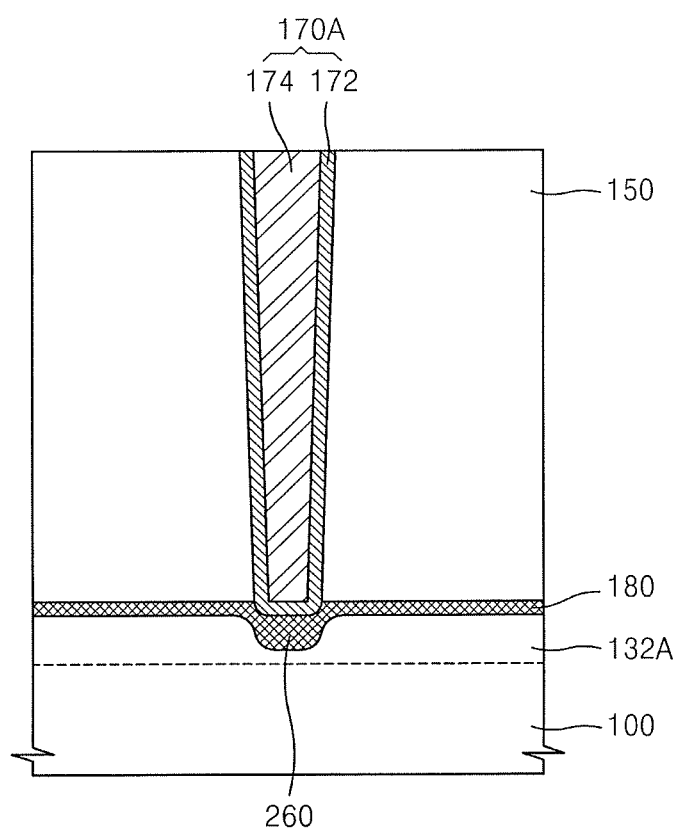

FIGS. 2a to 2e are cross sectional views showing a fabrication method of the semiconductor device including the metal silicide layer 180 shown in FIG. 2e, according to another exemplary embodiment of the inventive concept. In this exemplary embodiment, the steps illustrated in FIG. 1a to FIG. 1d are first performed to obtain the vertical opening (contact hole) 150H and the horizontal (planar) vacancy 160 shown in FIG. 1d and in FIG. 2a.

Referring to FIG. 2a, after forming the contact hole 150H and the vacancy 160, a metal liner 252 and then a capping layer 254 are conformably formed in the vertical opening 150H and on the first insulating layer 150, while the vacancy 160 remains vacant. The metal liner 252 may comprise one or more of Co, Ni, Hf, Pt, W, or Ti. The capping layer 254 may comprise TiN, and is formed to prevent the metal liner 252 from oxidizing during a heat treatment for the silicidation reaction.

While forming the metal liner 252 using PVD, CVD, MOCVD, ALD, or an electro-less plating method, a portion of the metal source supplied into the contact hole 150H is used to form the metal liner 252 and the other portion of the metal source flows into the horizontal (planar) vacancy 160.

Referring to FIG. 2b, a first metal silicide layer 260 is formed adjacent the bottom portion of the vertical opening 150H by reacting the metal liner 252 with the crystallized silicon layer 132A and a second metal silicide layer 180 is formed by reacting the same metal source into the horizontal (planar) vacancy with the crystallized silicon layer 132A. The first metal silicide layer 260 and the second metal silicide layer 180 are formed by rapid thermal annealing (RTA). In the case where Co is used as the metal liner, the RTA process can proceed at a temperature of about 400° C. to 600° C. In case where Ni is used as the metal liner, the RTA process can proceed at a temperature of about 250° C. to 350° C.

Referring to FIG. 2c, the unreacted portion of the metal liner 252 and the capping layer 254 are removed. An additional heat treatment may be further performed upon the resultant structure at a temperature of about 700° C. to 150-1° C.

Referring to FIG. 2d, as in the previous embodiment, a metal-containing layer 170 comprising a barrier metal layer 172 and a conductive metal layer 174 is formed on the first insulating layer 150 and within the vertical opening (contact hole) 150H.

Referring to FIG. 2e, as in FIG. 1f, a conductive plug 170A is formed remaining within the vertical opening (contact hole) 150H by removing the metal-containing layer 170 using CMP or an etch back until the top surface of the first insulating layer 150 is exposed.

In this embodiment, the first metal silicide layer 260 can be formed as part of the first metal silicide layer 180. And, the source metal of the metal silicide layers 260, 180 may be a component material different from the barrier metal layer 172.

Figure 3A:
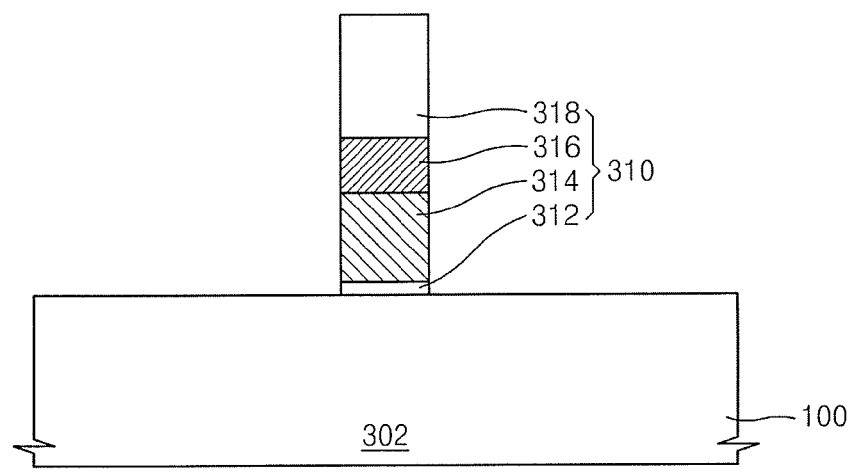
FIGS. 3a to 3j are cross sectional views showing a method of fabricating the field effect transistor (FET) shown in FIG. 3j including a metal silicide layer 180, according to an exemplary embodiment of the inventive concept.
Figure 3B:
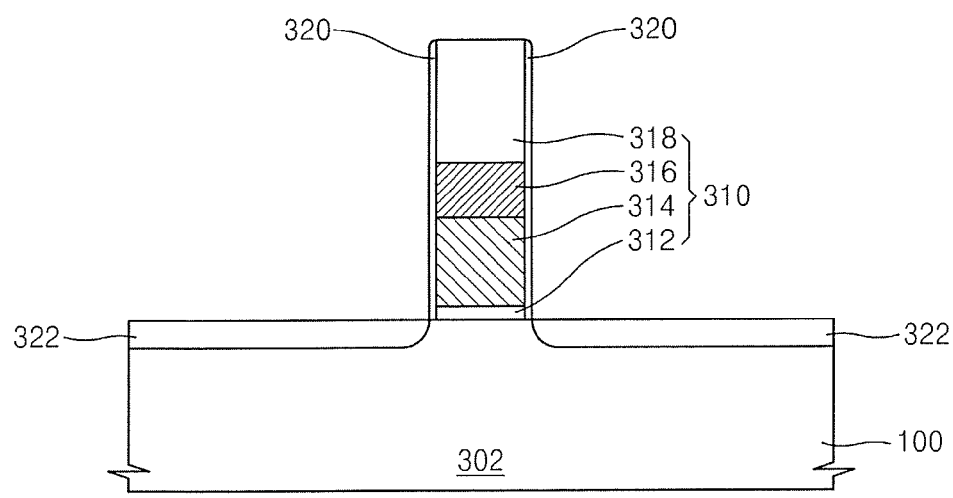
Figure 3C:
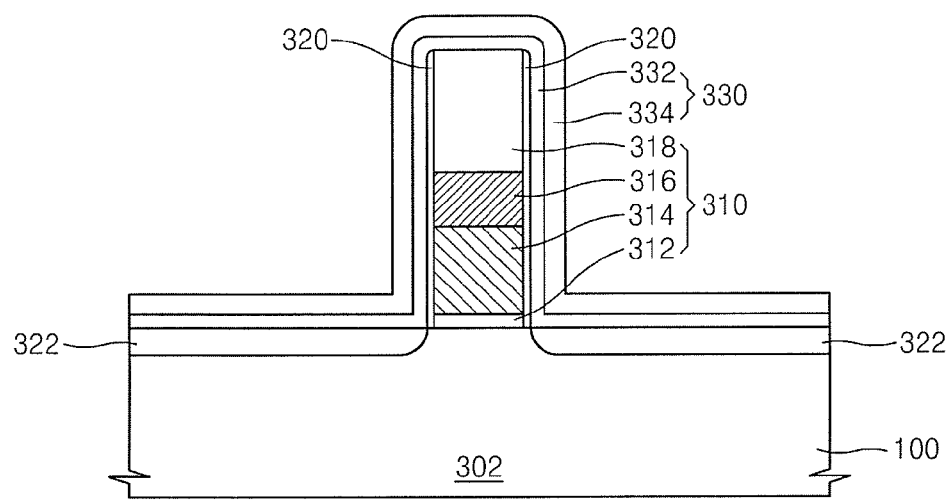
Figure 3D:
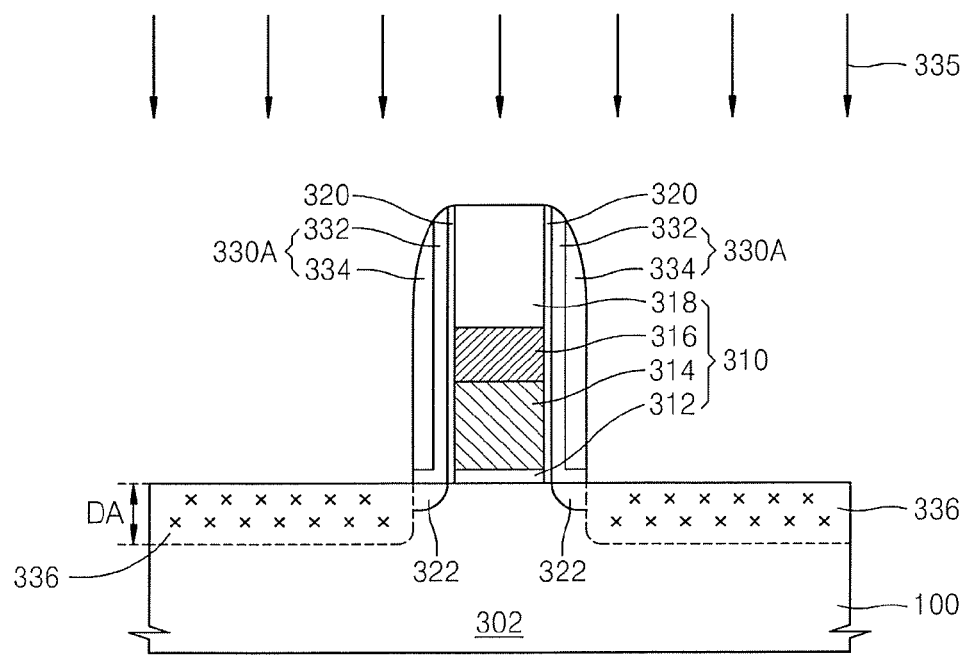
Figure 3E:
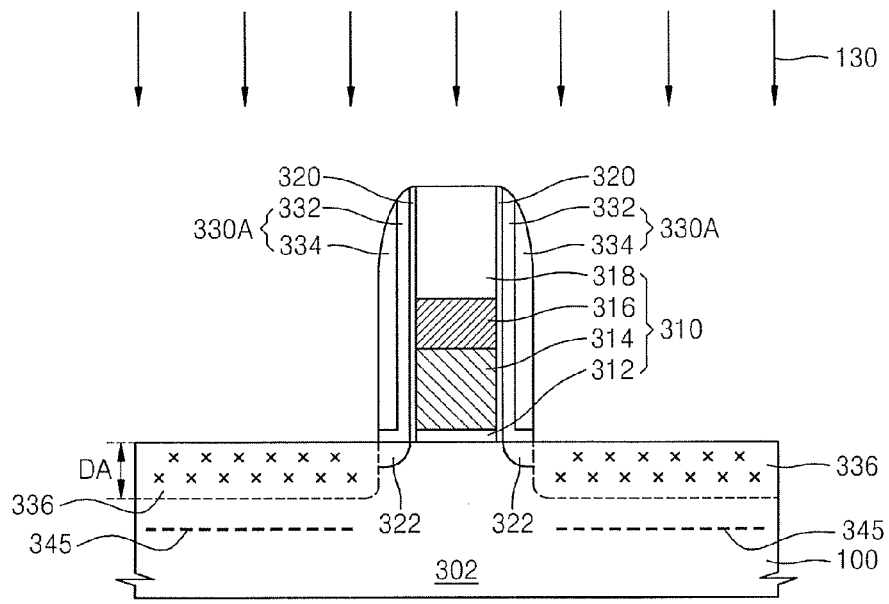
Figure 3F:
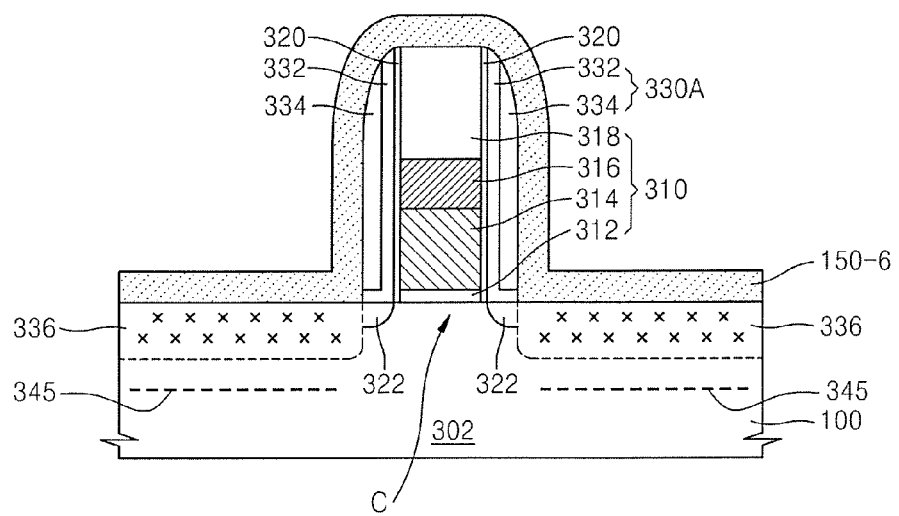
Figure 3G:
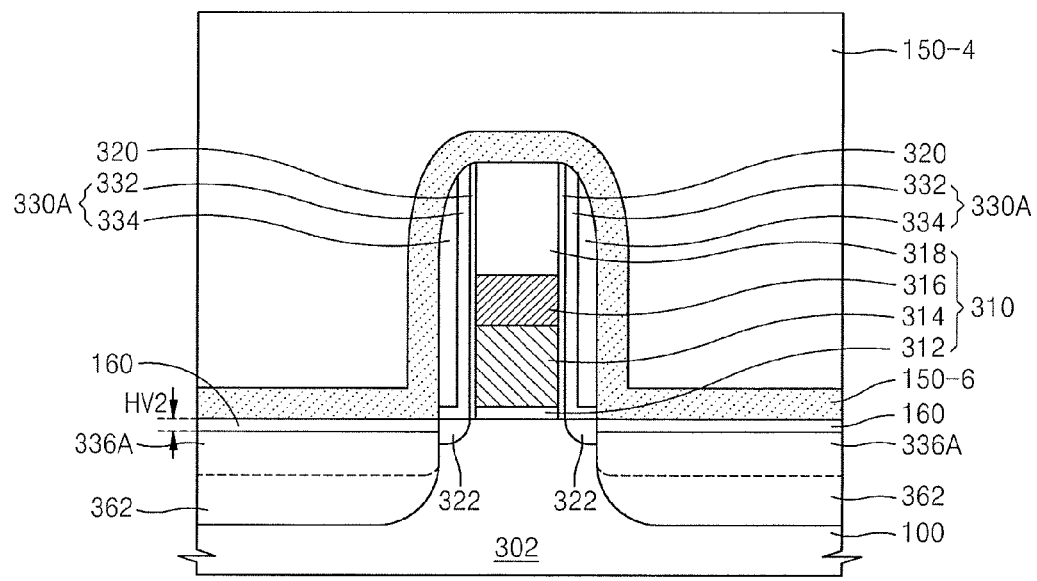
Figure 3H:
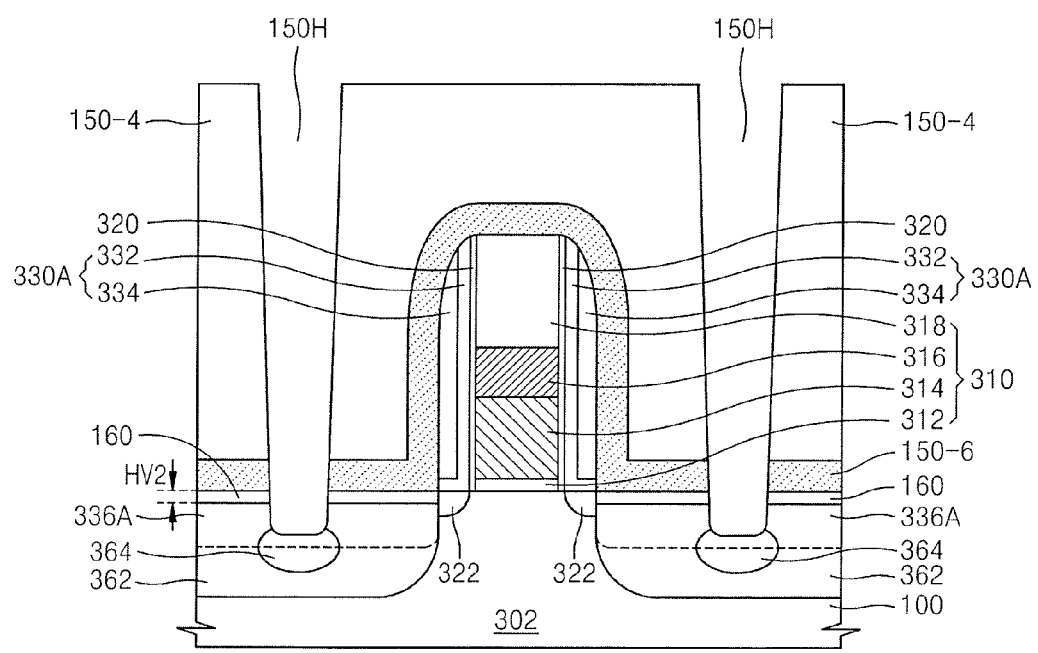
Figure 3I:
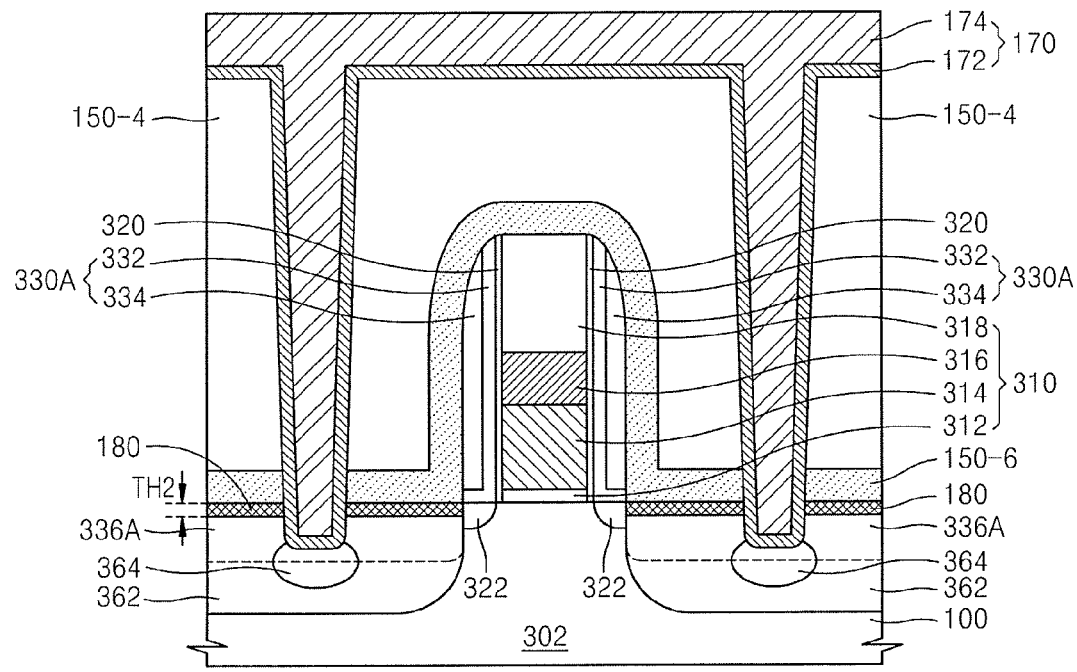
Figure 3J:
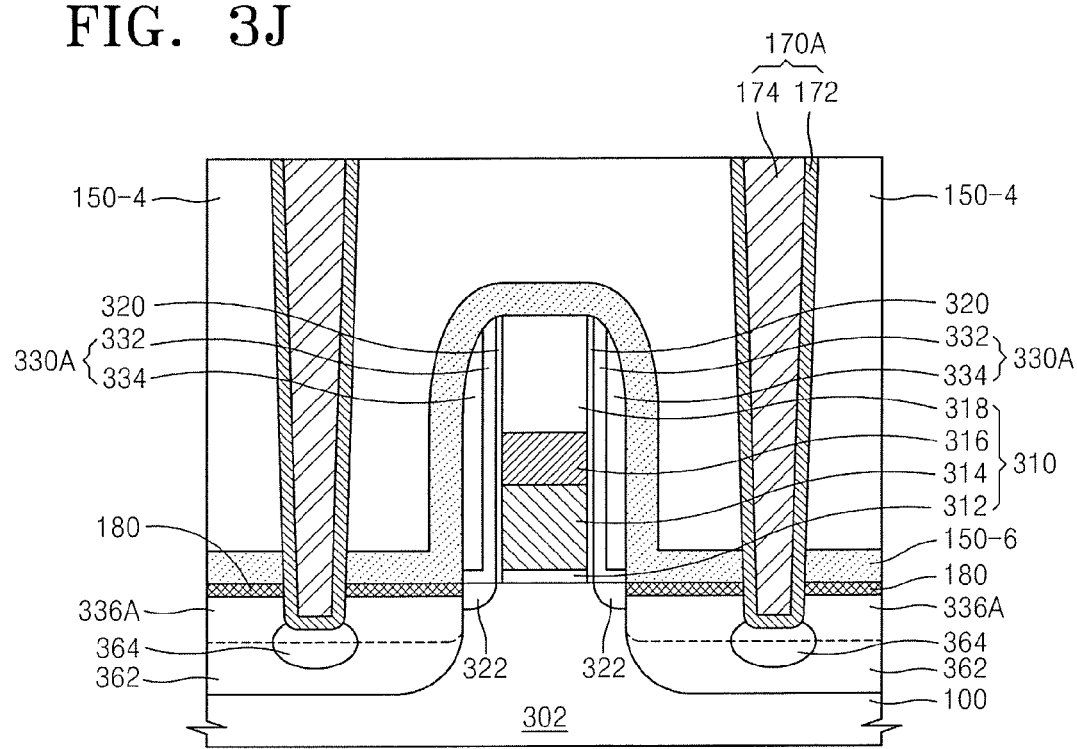

FIGS. 3a to 3j are cross sectional views showing a method of fabricating the field effect transistor (FET) shown in FIG. 3j including a metal silicide layer 180, according to another exemplary embodiment of the inventive concept.

Referring to FIG. 3a, a silicon substrate 100 of a first conduction type, for example, a conventional single crystal silicon substrate or an epitaxial growth silicon layer, is provided. A gate dielectric layer 312, a first gate conductive layer 314, a second gate conductive layer 316, and a capping insulating layer 318 are sequentially deposited on the active region 302 of the substrate 100, thus forming the gate stack structure 310. The active region 302 may be in a memory cell array region or in a peripheral circuit region of a memory device.

The first gate conductive layer 314 and the second gate conductive layer 316 constitute the gate electrode of the FET. The first gate conductive layer 314 may be made of doped poly-silicon. The second gate conductive layer 316 may be made of a metal-silicide (for example, $WSi_2$), or a metal. The capping insulating layer 318 may be made of a silicon nitride layer.

Referring to FIG. 3b, an offset insulating layer 320 is formed on the sidewalls of the gate stack 310 by conformally forming a insulating layer on the gate stack 310 and by etching the insulating layer, leaving the insulating layer only on the sidewalls of the FET's gate stack 310. The offset insulating layer 320 may be made of a nonconducting material, for example silicon nitride (SiN).

A lightly doped drain (LDD) junction region 322 is formed in the active region 302 adjacent to both sides of the FET's gate stack 310 using the gate stack 310 and the offset insulating layer 320 as an ion implantation mask.

Referring to FIG. 3c, a spacer insulating layer 330 is conformally formed on the FET's gate stack 310 and on the active region 302. The spacer insulating layer 330 may be made of $SiO_2$ or SiN, or a combination thereof. For example, the spacer insulating layer may comprise a first insulating layer 332 made of SiN and a second insulating layer 334 made of $SiO_2$. The lightly doped drain (LDD) junction region 322 extends beneath the spacer insulating layer 330 formed on the FET's gate stack 310.

Referring to FIG. 3d, an insulating spacer 330A is shaped covering the offset insulating layer 320 by etching the spacer insulating layer 330 using a plasma gas 335 until the top surface of the substrate 100 (302) is exposed.

Referring again to FIG. 3d, next an amorphous silicon layer 336 is formed in the substrate 100 (302) at a depth (DA) of from about 10 Å to 150 Å by a plasma 335. The plasma gas 335 may be example, CxFy (wherein x and y are integers ranging from 1 to 10, preferably C3F6, C4F6, C4F8, or C5F8) and/or $O_2$ and/or Ar.

The portion of the lightly doped drain (LDD) junction region 322 beneath the insulating spacer 330A formed on the FET's gate stack 310 is not converted into amorphous silicon.

Referring to FIG. 3e, an impurity ion 345 for example, a p-type or an n-type impurity, is injected under the amorphous silicon layer 336 in the source/drain regions in the substrate 100, using the FET's gate stack 310 and the insulating spacer 330A as a mask.

Referring to FIG. 3f, a stress control layer 150-6 (for example comprising SiN) having a thickness of 50 nm to 150 nm is conformally formed on the FET's gate stack 310 and on the active region 302 and a low temperature PECVD under 600° C. (Preferably, 200° C. to 400° C.). The stress control layer 150-6 may be used as an etch stopper layer during etching of an interlayer dielectric layer (e.g., 150-4) in a following step.

In an embodiment where the FET is an NMOS transistor formed on an n-doped active region 302, the stress control layer 150-6 comprises a layer that applies a tensile stress in the channel region (C), to enhance a current characteristic by increasing an electron mobility due to the tensile stress. (This tensile-inducing layer can be formed by UV treatment to remove a hydrogen component in SiN)

In an embodiment where the FET is a PMOS transistor formed on a p-doped active region 302, the stress control layer 150-6 comprises a layer that applies a compressive stress to the channel region (C), to enhance a current characteristic by increasing a hole mobility due to the compressive stress.

The stress control layer 150-6 prevents an interface reaction (reduces adhesion) between the amorphous silicon layer 336 and the stress control layer 150-6 during crystallization of the amorphous silicon layer 336 in the following step. The stress control layer 150-6 allows the crystallized silicon layer 336A to be easily separated from the stress control layer 150-6 to facilitate the formation of the horizontal (planar) vacancy 160 during crystallization of the amorphous silicon layer 336.

Referring to FIG. 3g, an interlayer dielectric layer 150-4 is formed on the stress control layer 150-6 at a high temperature of from 600 EC to 800 EC. The interlayer dielectric layer 150-4 may be made the same as the first insulating layer 150 of the first embodiment.

The high temperature heat of from 600 EC to 800 EC changes the amorphous silicon layer 336 to a crystallized silicon layer 336A and concurrently forms a vacancy 360 having a thickness HV2 of about 1 Δ to 100 Δ. Meanwhile the heat or an additional heat treatment step forms the source/drain region 362 in the substrate 100 adjacent both sides of the gate stack 310 by activating (distributing) the implanted impurity ions 345.

Referring to FIG. 3h, as in FIG. 1d, a vertical opening (contact hole) 150H is formed connected to the horizontal (planar) vacancy 160 by etching the interlayer dielectric layer 150-4 and the stress control layer 150-6. The vertical opening (contact hole) 150H may have the shape of a hole type, or line type. A portion of the crystallized silicon layer 336A may or may not be removed by the etching of the interlayer dielectric layer 150-4.

A contact plug ion implantation region 364 is formed at the portion of the substrate 100 (active region 302) exposed by the opening 150H by ion implantation of an impurity ion of the same conductive type as the impurity ion 345 used for the source/drain region 362. The implanted impurity ions are activated (distributed) at a high temperature of about 1100 EC by, for example, using a rapid thermal annealing (RTA) process. The heat at a high temperature of about 1100 EC can fully crystallize the amorphous silicon layer 336.

Referring to FIG. 3i, as in FIG. 1e, a metal containing layer 170 comprising a barrier layer 172 and a conductive layer 174 is formed in the contact hole 150H and concurrently forms a metal silicide layer 180 in the vacancy 160 having a thickness (TH2) of from about 5Δ to 100Δ, preferably, from 50Δ to 70Δ. The metal containing layer 170 comprises a single metal such as Ti, TiN, Co, Ni, Hf, Pt, W etc. In this case the single metal reacts with the crystallized silicon layer 132A to form the metal silicide layer 180.

Referring to FIG. 3j, as in FIG. 1f, a conductive plug 170 is formed by removing the metal-containing layer 170 using CMP or an etch back until the top surface of the interlayer dielectric layer 150-4 is exposed. Thus, the FET is complete and is ready to be interconnected with other device elements through patterned metallization layers formed on or above the top surface of the interlayer dielectric layer 150-4.

Figure 4A:
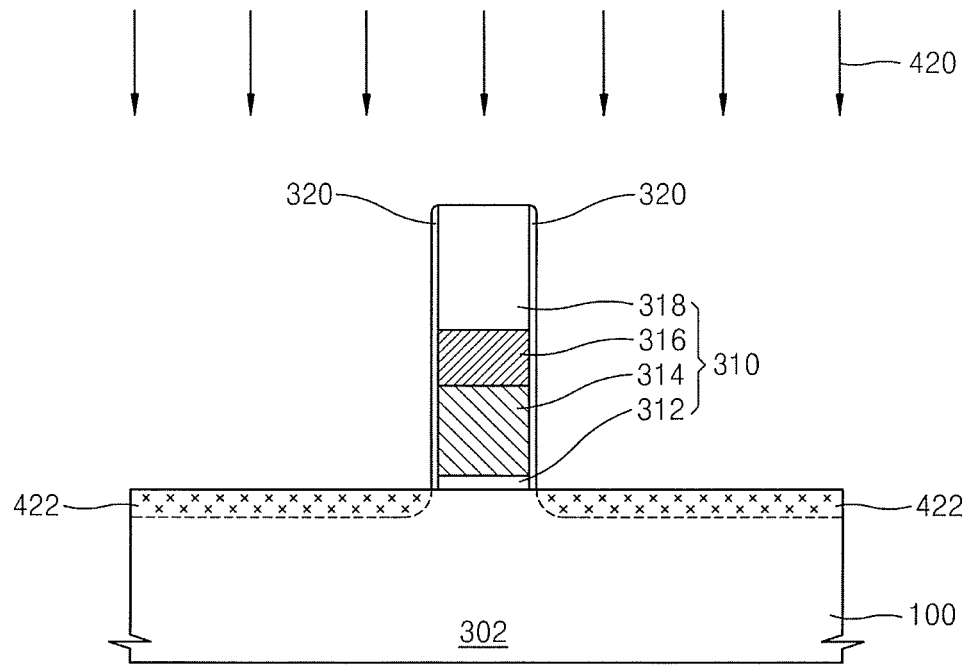
FIGS. 4a to 4f are cross sectional views showing a method of fabricating the FET shown in FIG. 4f including a metal silicide layer 180 fabricated according to an exemplary embodiment of the inventive concept.
Figure 4B:
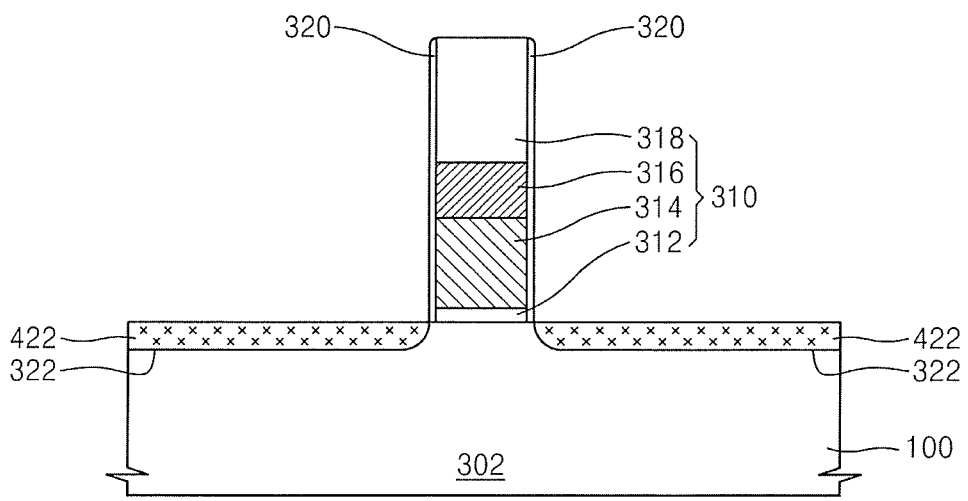
Figure 4C:
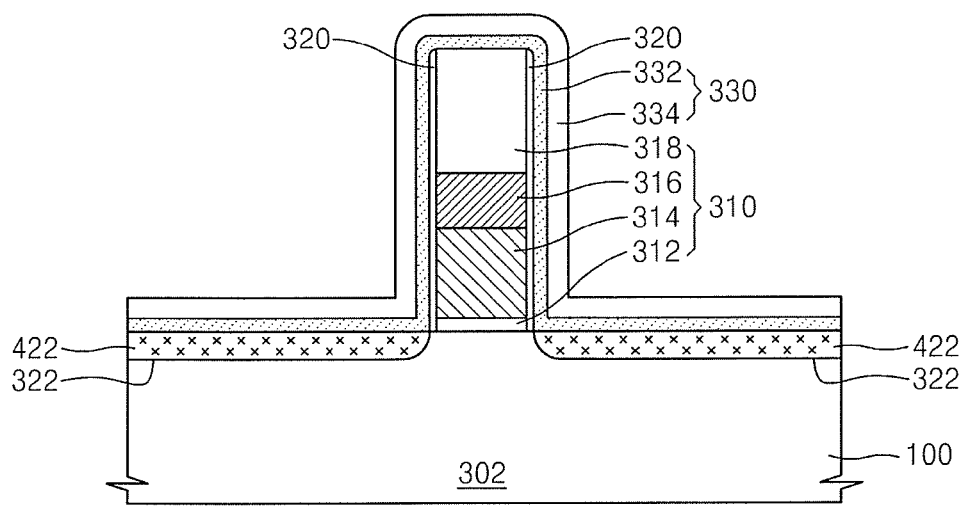
Figure 4D:
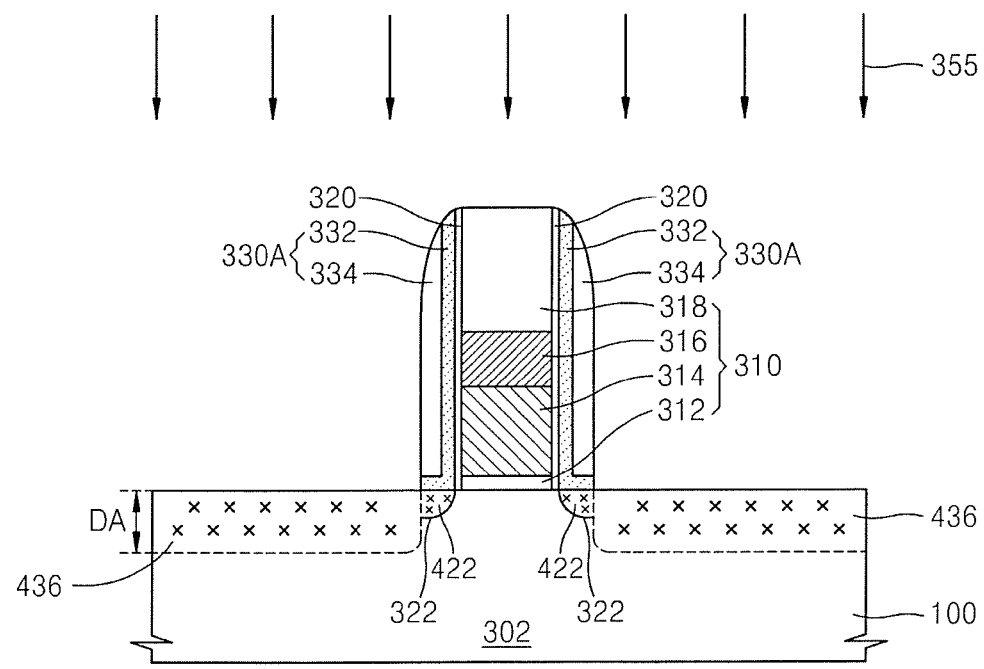
Figure 4E:
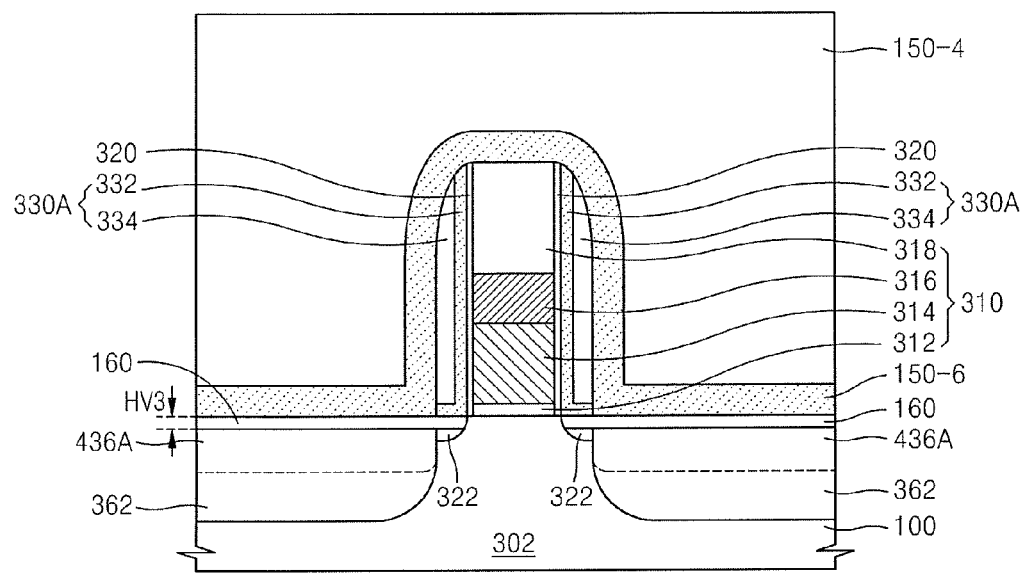
Figure 4F:
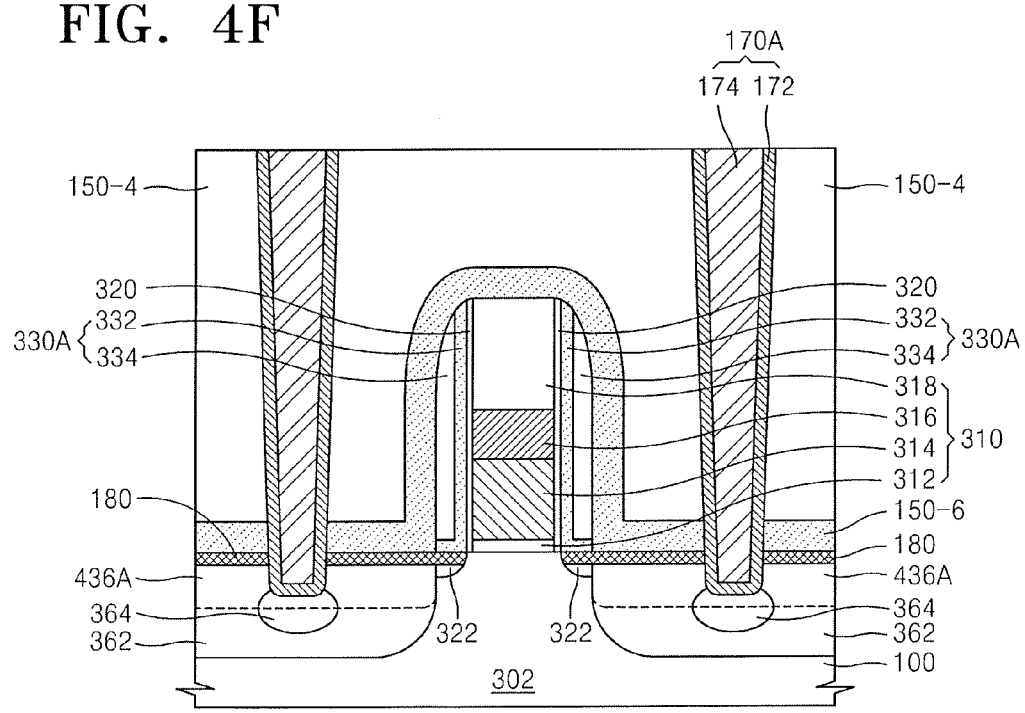

FIGS. 4a to 4f are cross sectional views showing a method of fabricating the FET shown in FIG. 4f including a metal silicide layer 180, according to an exemplary embodiment of the inventive concept.

Referring to FIG. 4a, as in FIGS. 3a and 3b, the gate stack 310 and the offset insulating layer 320 are formed on the active region 302 having a first or second conductivity type, on the substrate 100.

Referring again to FIG. 4a, unlike in the embodiment shown in FIGS. 3a to 3e, the first amorphous silicon layer 422 is formed after the offset insulating layer 320 is formed on the sidewalls of the FET gate stack 310 on the substrate 100 (302) but before the spacer insulating layer 330 and insulating spacer 330A are formed. The first amorphous silicon layer 422 may be produced by using the plasma gas 335 as in FIG. 3d.

Referring to FIG. 4b, a LDD junction region 322 is formed in the substrate 100 (302) adjacent both sides of the FET gate stack structure 310 by an ion implantation using the gate stack 310 and the offset insulating layer 320 as an ion implantation mask.

Referring to FIG. 4c, as in FIG. 3f, a first stress control layer 332 is formed on the FET gate stack structure 310 and over a portion of the first amorphous silicon layer 422 adjacent to both sides of the FET gate stack structure 310. A spacer insulating layer 434, for example, SiO$_2$, is formed on the first stress control layer 332.

Referring to FIG. 4d, a portion of the first stress control layer 332 and the horizontal portions of the spacer insulating layer 434 are removed by etching the spacer insulating layer 434 and the first stress control layer 332. The horizontal portions of the first stress control layer 332 formed over the first amorphous silicon layer 422 and overlapped by the vertical portions of the spacer insulating layer 434 remain intact.

Referring again to FIG. 4d, a second amorphous silicon layer 436 having a depth (DA) of from about 10 Å to 150 Å, is formed using the insulating spacer 434 as a mask, using a plasma gas 435 which may be the same to the plasma gas 335 of FIG. 3d. The second amorphous silicon layer 436 has a depth greater than the first amorphous silicon layer 422.

Referring to FIG. 4e, as in FIGS. 3e to 3g, the impurity ion 345 for S/D regions 362, the (second) stress control layer 150-6 and the interlayer dielectric layer 150-4 are sequentially formed. And thus, a crystallized silicon layer 436A, a horizontal (planar) vacancy 160 having a thickness of HV3, and a source/drain region 362 are formed. The horizontal (planar) vacancy 160 extends over the extension 322 remaining from of the LDD junction region 322 that remains below the first stress control layer 332 and the remaining portions of the spacer insulating layer 434.

Referring to FIG. 4f, as in FIGS. 3h to 3j, an interlayer dielectric layer 150-4, a contact plug ion implantation region 364, a metal silicide layer 180 being filled into a horizontal (planar) vacancy 160, and a conductive plug 170A are formed. The metal silicide layer 180 extends into the extension 322 remaining from the LDD junction region 322 that remains below the first stress control layer 332 and the remaining portions of the spacer insulating layer 434. The metal silicide layer 180 is sandwiched between the crystallized silicon layer 436A and the first and second stress control layers 332 150-6. Thus, the FET is complete and is ready to be interconnected with other device elements through patterned metallization layers formed on or above the top surface of the interlayer dielectric layer 150-4.

Figure 5A:
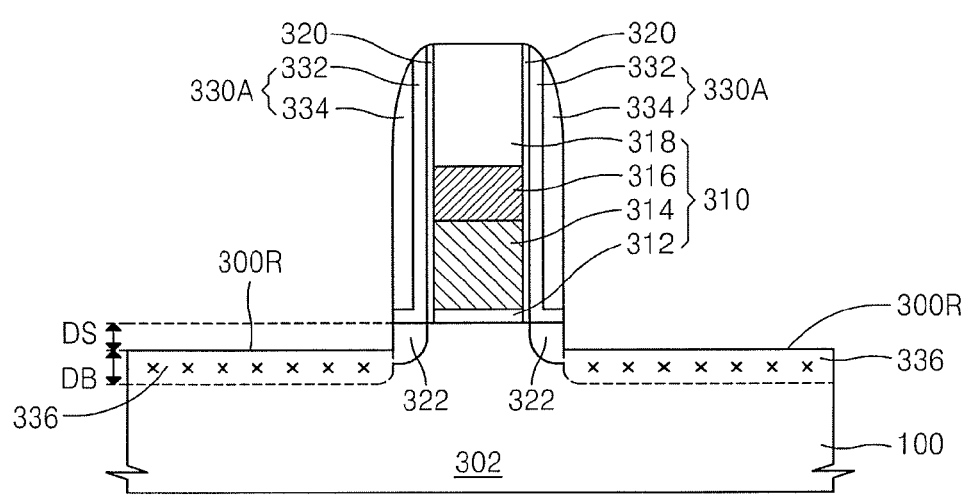
FIGS. 5a to 5c are cross sectional views showing a method of fabricating the FET shown in FIG. 5c including a metal silicide layer 180, according to an exemplary embodiment of the inventive concept.
Figure 5B:
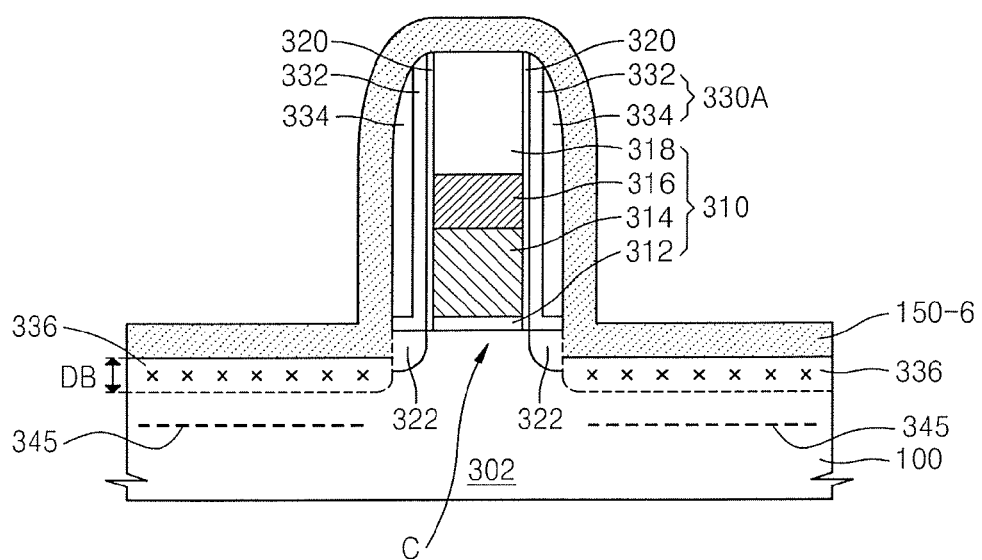
Figure 5C:
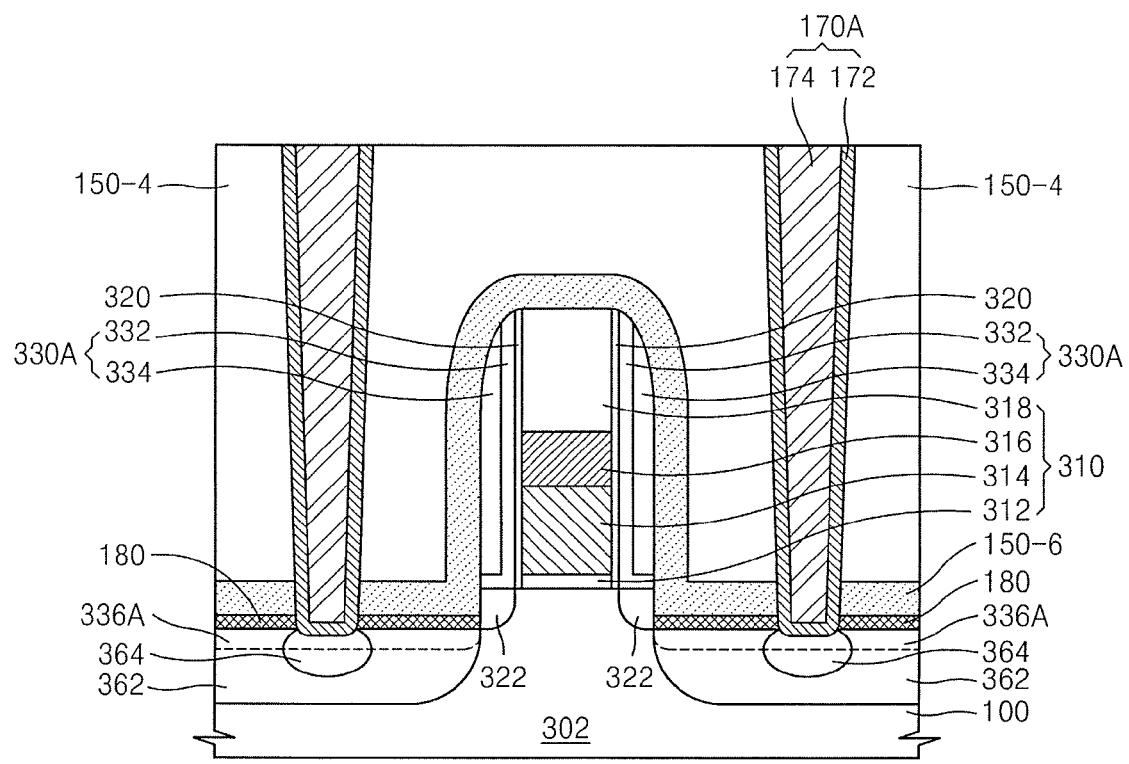

FIGS. 5a to 5c are cross sectional views showing a method of fabricating the FET shown in FIG. 5c, according to an exemplary embodiment of the inventive concept. In the FET of FIG. 5c, the metal silicide layer 180 is formed at a level lower than the top surface of the remaining extension 322 of the LDD junction region 322.

Referring to FIG. 5a, as in FIGS. 3a to 3d, the FET gate stack 310, the offset insulating layer 320, the LDD junction region 322, and the spacer insulating layer 330 (comprising a SiN 332 and a SiO$_2$ 334), an insulating spacer 330A is formed. The insulating spacer 330A is formed by etching back the spacer insulating layer 330. Then, a recessed surface 300R is formed by etching the substrate 100 to a depth (DS) below the original surface thereof using an (e.g., the same) etch back process. The amorphous silicon layer 336, preferably from 10 Å to 150 Å thick, is formed at a depth (DB being preferably 10 Å to 150 Å) from the recessed surface 300R.

Referring to FIG. 5b, as in FIGS. 3e to 3f, an impurity ion 345 is injected to form doped S/D regions, and a stress control layer 150-6 is formed.

The distance between the channel region (C) and the stress control layer 150-6 of FIG. 5b is shorter than the distance between the channel region (C) and the stress control layer 150-6 in FIG. 3f, so the carrier mobility (electron or hole) at the channel region (C) in the FET of FIG. 5c is increased. Due to the recessed surface of the amorphous silicon layer 336, the distance between the S/D regions 362 and the FETs gate stack 310 is increased, thereby decreasing the short channel effect of the transistor.

Referring to FIG. 5c, an interlayer dielectric layer 150-4, a contact plug ion implantation region 364, a metal silicide layer 180 being filled into a vacancy 160, and a conductive plug 170A are formed, as in FIGS. 3g to 3j. The metal silicide layer 180 at a level lower than the top surface of the remaining extension 322 of the LDD junction region 322.

Figure 6A:
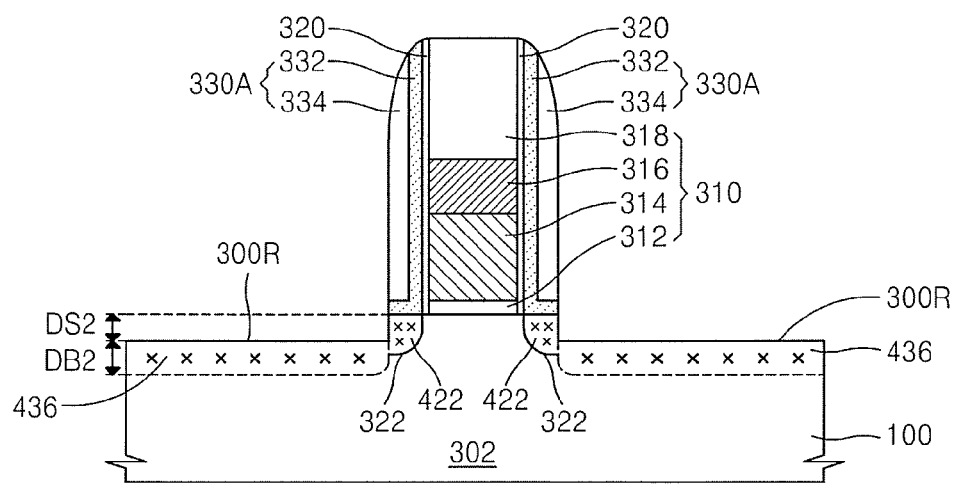
FIGS. 6a to 6c are cross sectional views showing a method of fabricating the FET shown in FIG. 6c including a bi-level metal silicide layer 480, according to an exemplary embodiment of the inventive concept.
Figure 6B:
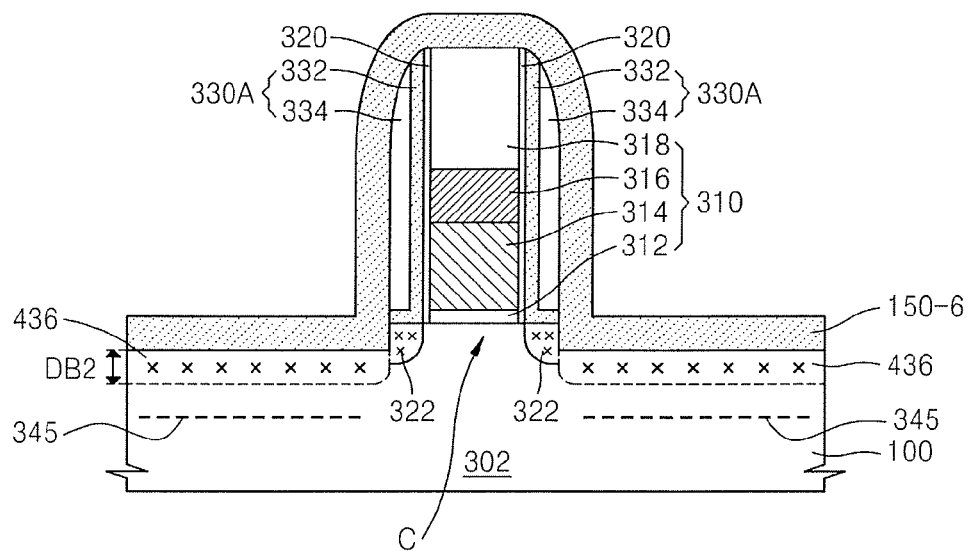
Figure 6C:
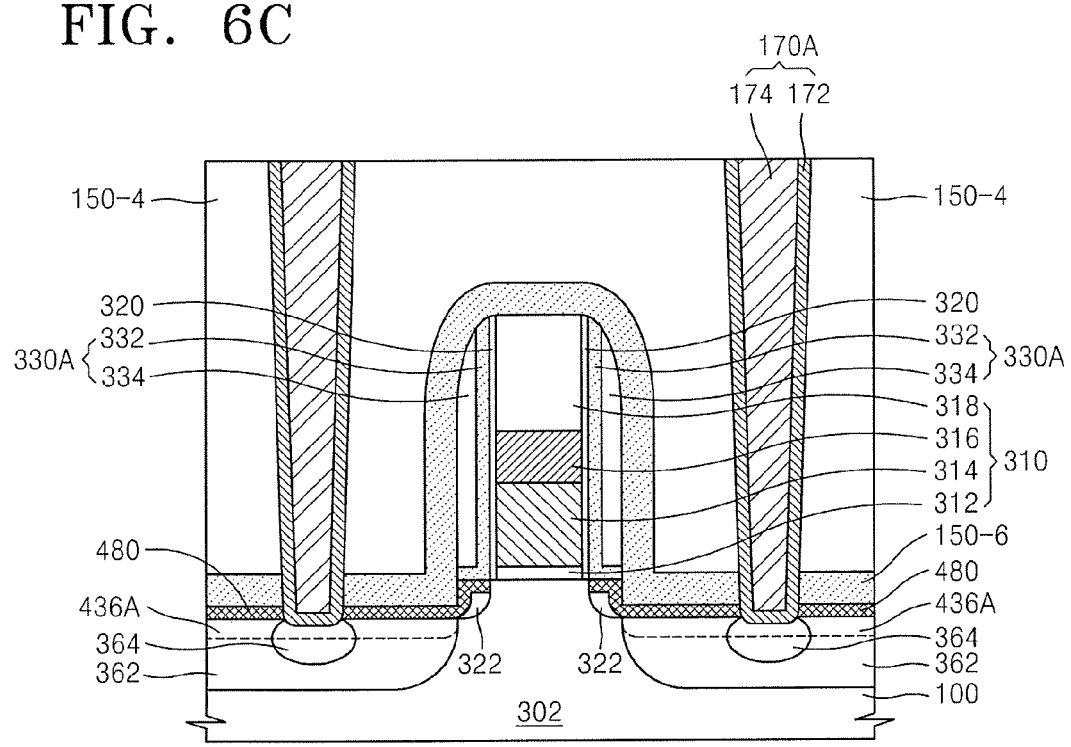

FIGS. 6a to 6c are cross sectional views showing a method of fabricating the FET shown in FIG. 6c including a bi-level metal silicide layer 480, according to another exemplary embodiment of the inventive concept. In the FET of FIG. 6c, a first (lower) portion 180 of the metal silicide layer 480 is formed at a level lower than the top surface of the remaining extension 322 of the LDD junction region 322, and a second (upper) portion 180 of the metal silicide layer 480 extends into an upper portion of the extension 322.

Referring to FIG. 6a, as in FIGS. 4a to 4d, the gate stack 310, the offset insulating layer 320, the first amorphous silicon layer 422, the LDD junction region 322, the first stress control layer 332, and the spacer insulating layer 434 are formed. Then an insulating spacer 330A is formed by etching back the spacer insulating layer 434 and the first stress control layer 332. Then, a recessed surface 300R is formed by etching the substrate 100 as a depth (DS2) from the surface thereof using the etch back process, and a second amorphous silicon layer 436 is formed to a depth (DB2) from the recessed surface 300R, preferably, 10Å to 150Å.

Referring to FIG. 6b, as in FIG. 4e, an impurity ion 345 is implanted for forming S/D regions 362, and the (second) stress control layer 150-6 are formed.

The distance between the channel region (C) and the stress control layer 150-6 in FIG. 6c is shorter than the distance between the channel region (C) and the stress control layer 150-6 in FIG. 4e, thus increasing the carrier mobility at the channel region (C). Due to the recessed surface 300R, the distance between the S/D region 362 and the FET's gate stack 310 increases, thus decreasing the short channel effect of the transistor in FIG. 6c.

Referring to FIG. 6c, an interlayer dielectric layer 150-4, a contact plug ion implantation region 364, and a conductive plug 170A are formed, as in FIGS. 3g to 3j and FIGS. 4e to 4f.

The metal silicide layer 480 (180) is filled in a vacancy that conformed to the lower surfaces of the first and second stress control layers 332 & 150-6.

Figure 7A:
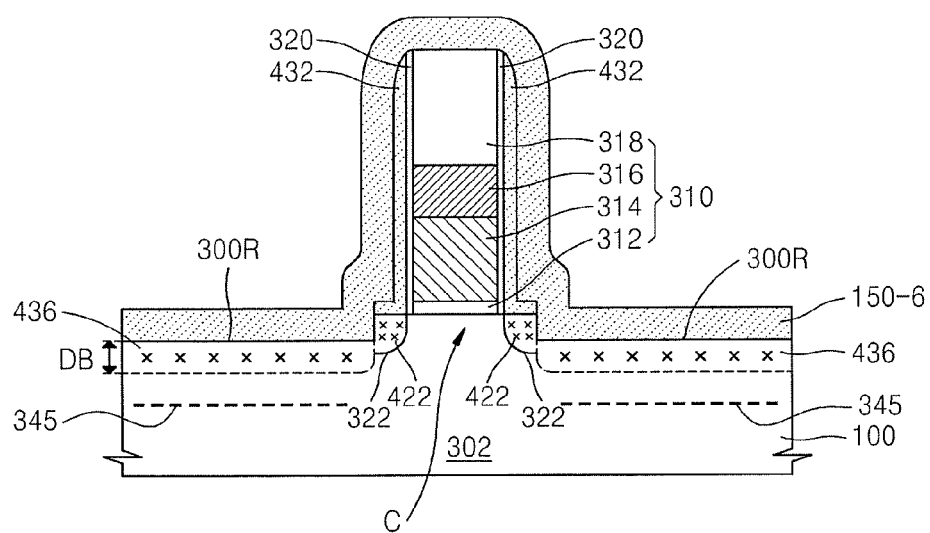
FIGS. 7a to 7b are cross sectional views showing a fabrication method of a semiconductor device, according to an exemplary embodiment of the inventive concept.
Figure 7B:
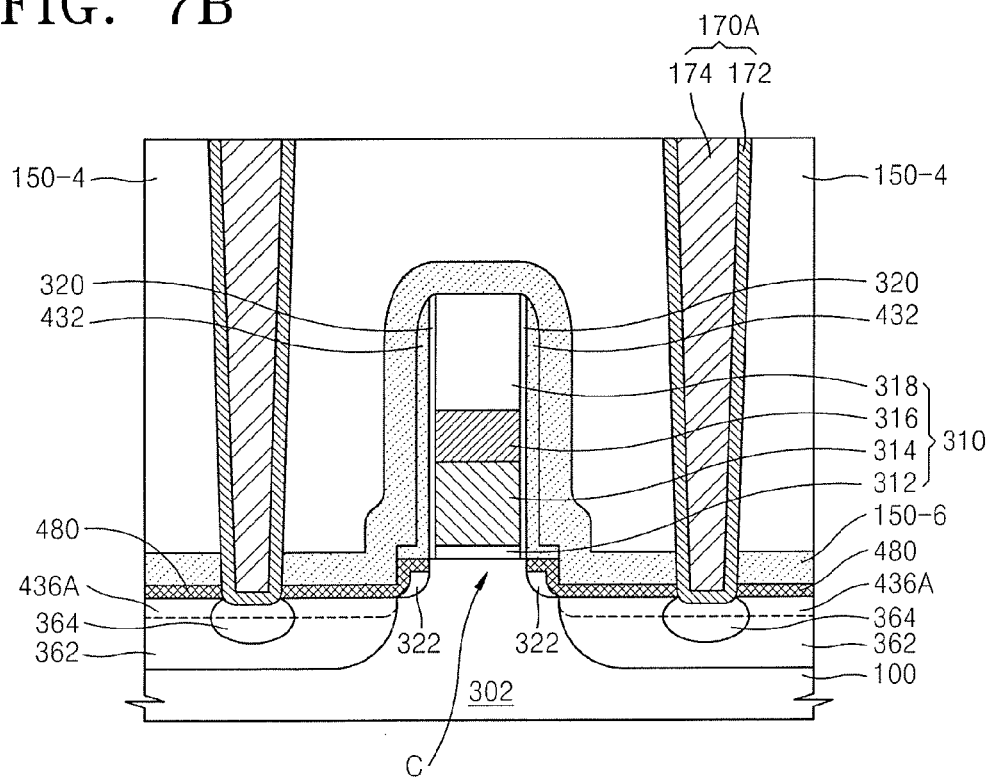

FIGS. 7a to 7b are cross sectional views showing a method of fabricating the FET shown in FIG. 7b including a bi-level metal silicide layer 480, according to an exemplary embodiment of the inventive concept.

Referring to FIG. 7a, the intermediate structure in FIG. 7a is similar to that of FIG. 6b of the 6th embodiment, except that after forming the insulating spacer 330A (FIG. 6b) comprising the first stress control layer 332 and the spacer insulating layer 434 and after forming the second amorphous silicon layer 436, the spacer insulating layer 434 is entirely removed to expose the sidewalls of the first stress control layer 332. Then the (second) stress control layer 150-6 is formed on the resultant structure.

Referring to FIG. 7a, the same as in FIG. 6c, an interlayer dielectric layer 150-4, a contact plug ion implantation region 364, and a conductive plug 170A are formed, as in FIGS. 3g to 3j and FIGS. 4e to 4f. The bi-level metal silicide layer 480 (180) is filled in a vacancy that conformed to the lower surfaces of the first and second stress control layers 332 & 150-6.

The metal silicide layer 180 is formed at the level lower than a top surface of the extension 322 and extends into an upper portion of the extension 322.

The carrier mobility at the channel region (C) of the FET of FIG. 7b is further increased due to the absence of any layer between the first and second stress control layers 332, 150-6.

Figure 8A:
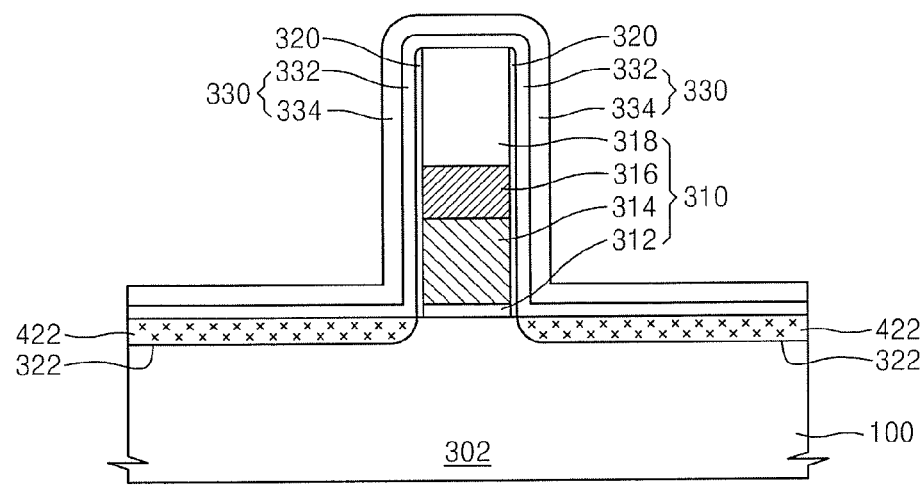
FIGS. 8a to 8f are cross sectional views showing a fabrication method of the semiconductor device including the FET shown in FIG. 8f, according to an exemplary embodiment of the inventive concept.
Figure 8B:
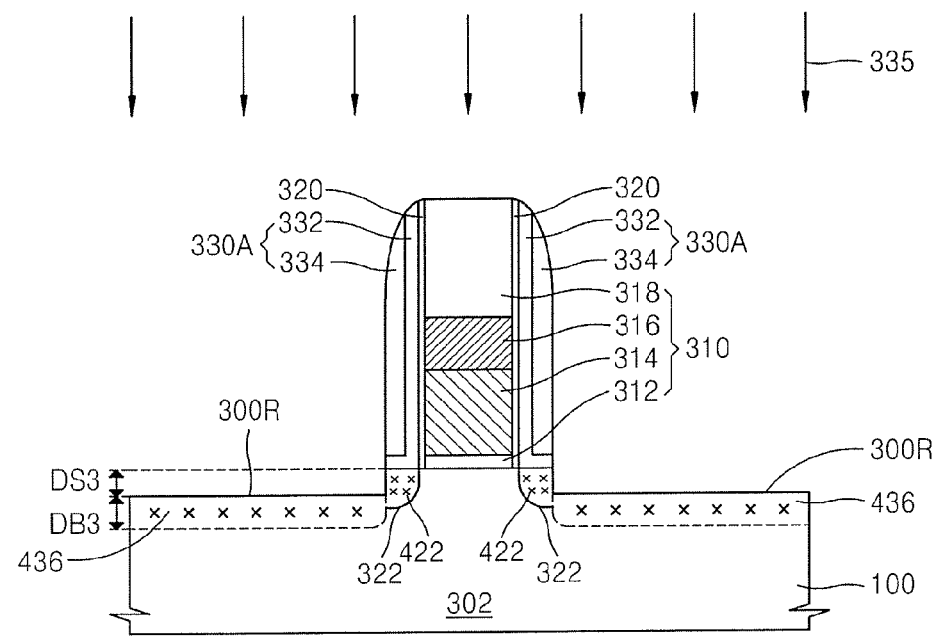
Figure 8C:
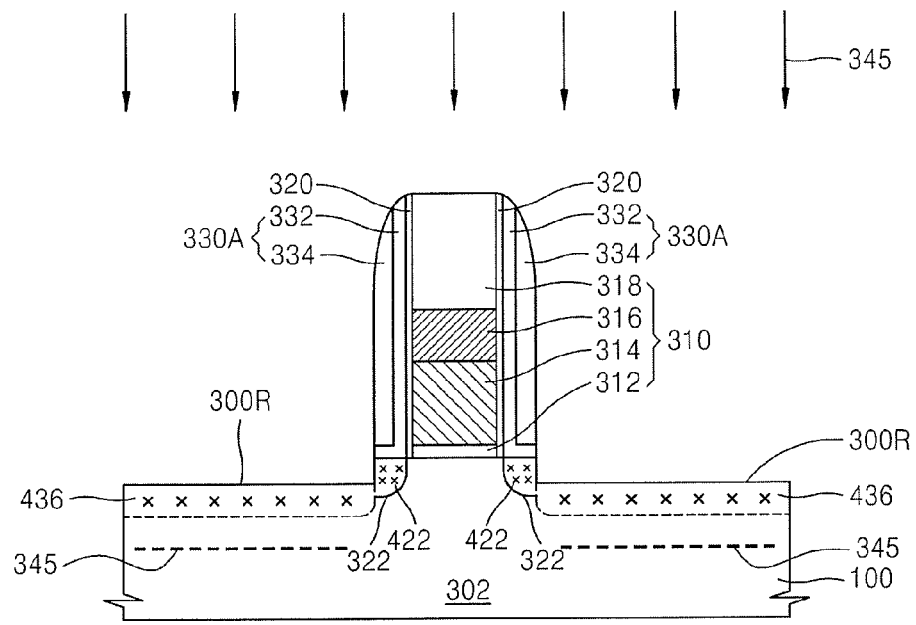
Figure 8D:
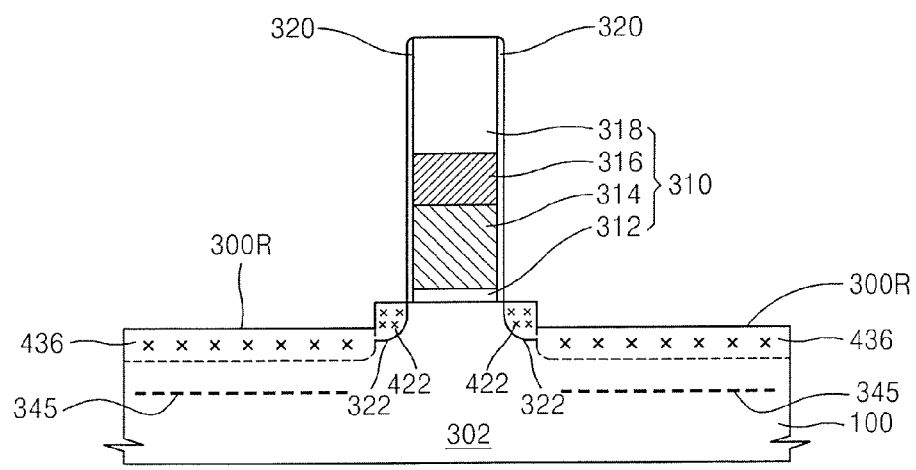
Figure 8E:
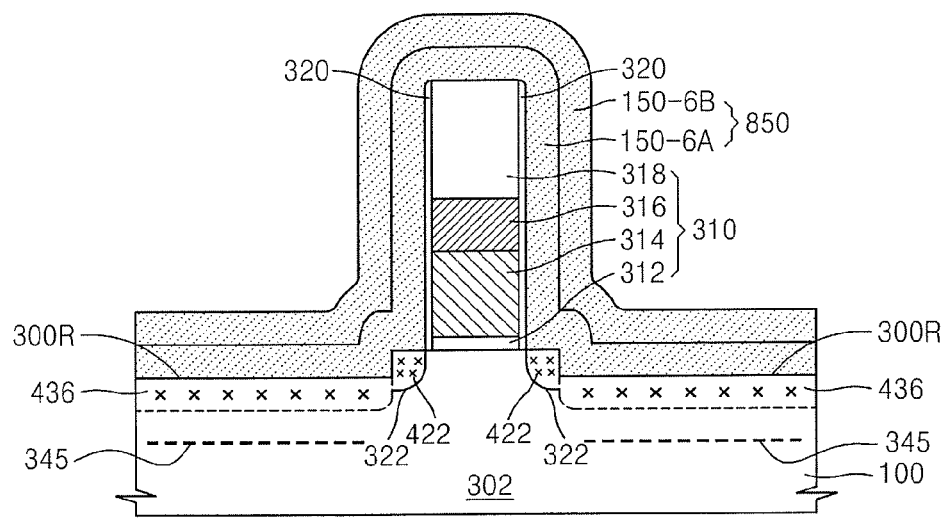
Figure 8F:
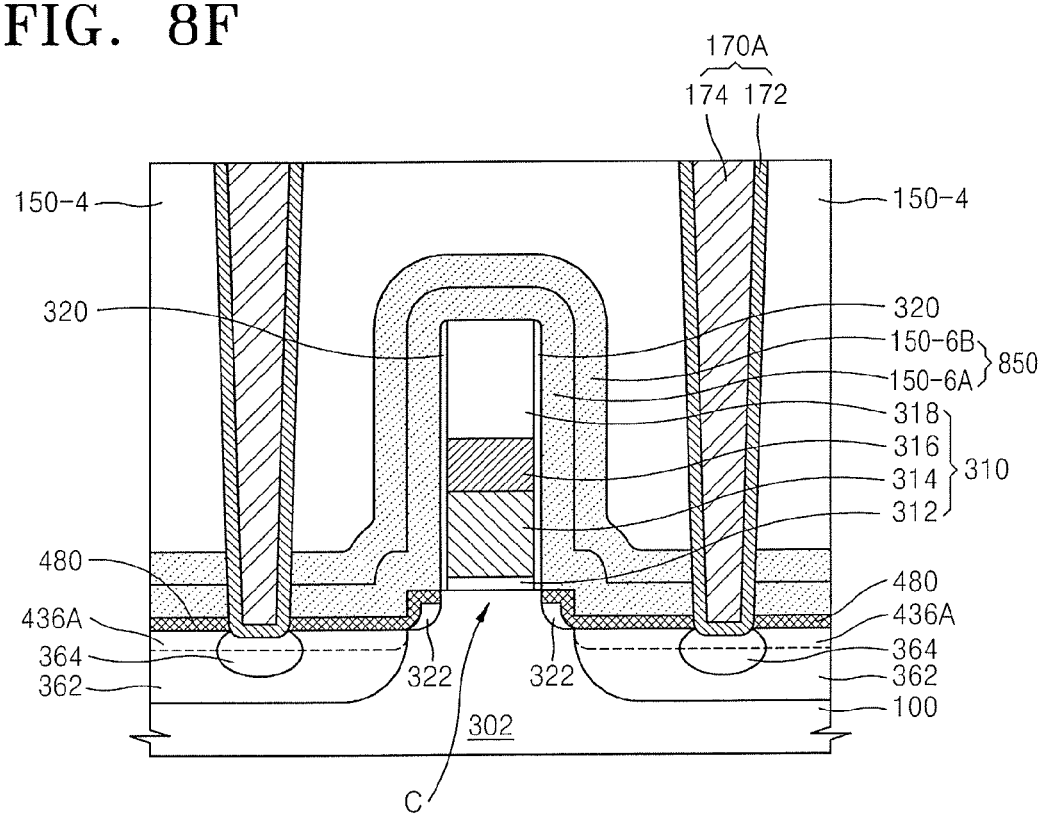

FIGS. 8a to 8f are cross sectional views showing a method of fabricating the FET shown in FIG. 8f including a bi-level metal silicide layer 480, according to an exemplary embodiment of the inventive concept.

Referring to FIG. 8a, the intermediate structure shown in FIG. 8a is the same as an intermediate structure of FIG. 6a, and is fabricated in a like manner. The FET's gate stack 310 and the offset insulating layer 320, and the first amorphous silicon layer 422 are formed as depicted in FIG. 4a, and then, the LDD junction region 322 is formed as depicted in FIG. 4b, and then, the spacer insulating layer 330 (comprising the SiN 332 and the SiO$_2$ 334) is formed as depicted in FIG. 3c.

Referring to FIG. 8b, the intermediate structure shown in FIG. 8b is the same as the intermediate structure shown in FIG. 6a. The insulating spacer 330A is formed as depicted in FIG. 3d, and the recessed surface 300R is formed at a depth of DS3 as in FIG. 5a, and the second amorphous silicon layer 436 is formed at a depth DB3 of from about 10 Å to 150 Å as in FIG. 6a.

Referring to FIG. 8c, as in FIG. 3e, the impurity ion 345 is injected for forming S/D regions in the substrate 100 using the gate stack 310, the offset insulating layer 320 and the insulating spacer 330A as an ion implantation mask.

Referring to FIG. 8d, the insulating spacer 330A is entirely removed to expose the sidewalls of the offset insulating layer 320 and the top surface of the first amorphous silicon layer 422.

Referring to FIG. 8e, a plurality of stress control layers 850 comprising a first stress control layer 150-6A and a second stress control layer 150-6B are formed covering the first and second amorphous silicon layers 422, 436. The first and second stress control layers 150-6A, 150-6B may have the same material as each other or different materials, for example both may be comprised of SiN, the same as in the second stress control layer 150-6 of FIG. 6b.

Referring to FIG. 8f, the first (lower) portion 180 of the metal silicide layer 480 is formed at a level lower than the top surface of the remaining extension 322 of the LDD junction region 322, and a second (upper) portion 180 of the metal silicide layer 480 extends into an upper portion of the extension 322. The bi-level metal silicide layer 480 (180) is filled in a vacancy that conformed to the lower surfaces of the first stress control layer 150-6A, as in FIG. 6c.

The carrier mobility at the channel region (C) of the FET of FIG. 8f is further increased due to the absence of any layer between the first and second stress control layers 150-6A, 150-6B.

Figure 9:
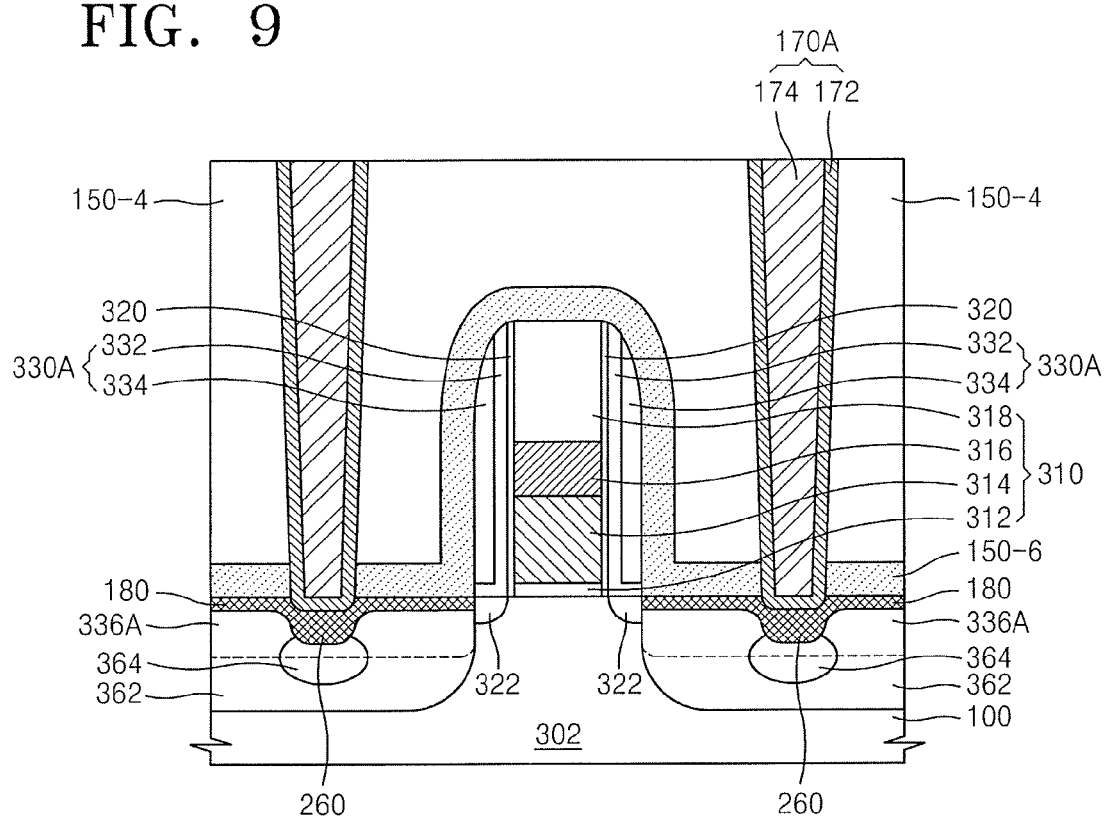
FIG. 9 is a FET fabricated according to an exemplary embodiment of the inventive concept.

FIG. 9 is a FET fabricated according to an exemplary embodiment of the inventive concept. In the FET of FIG. 9, the first metal silicide layer 260 is formed below the bottom of the vertical conductive plug 170A as in FIG. 2e and the (second) horizontal (planar) metal silicide layer 180 abuts the lightly doped drain (LDD) junction region 322 extending beneath the insulating spacer 330A formed on the FET's gate stack 310, as in FIG. 3j.

Figure 10:
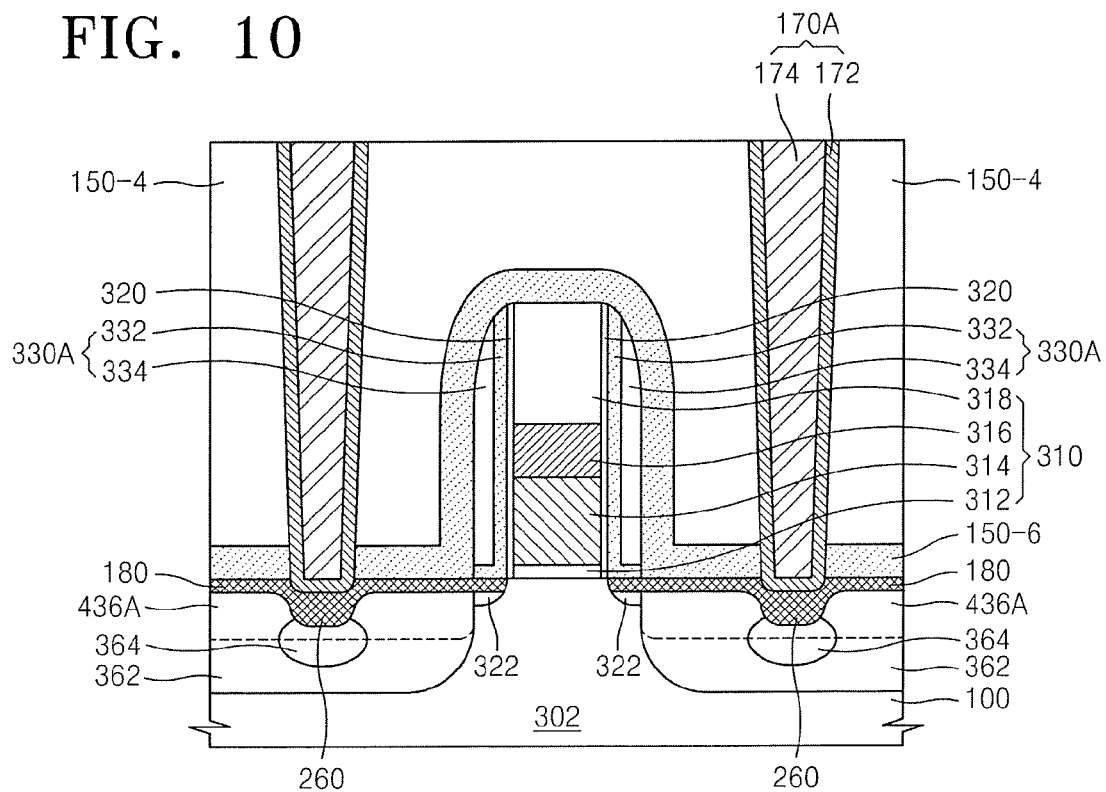
FIG. 10 is a FET fabricated according to an exemplary embodiment of the inventive concept.

FIG. 10 is a FET fabricated according to an exemplary embodiment of the inventive concept. In the FET of FIG. 10, the first metal silicide layer 260 is formed at the bottom of the vertical conductive plug 170A as in FIG. 2e, and the (second) horizontal (planar) metal silicide layer 180 extends into the lightly doped drain (LDD) junction region 322 extending beneath the insulating spacer 330A formed on the FET's gate stack 310, as in FIG. 4f.

Figure 11:
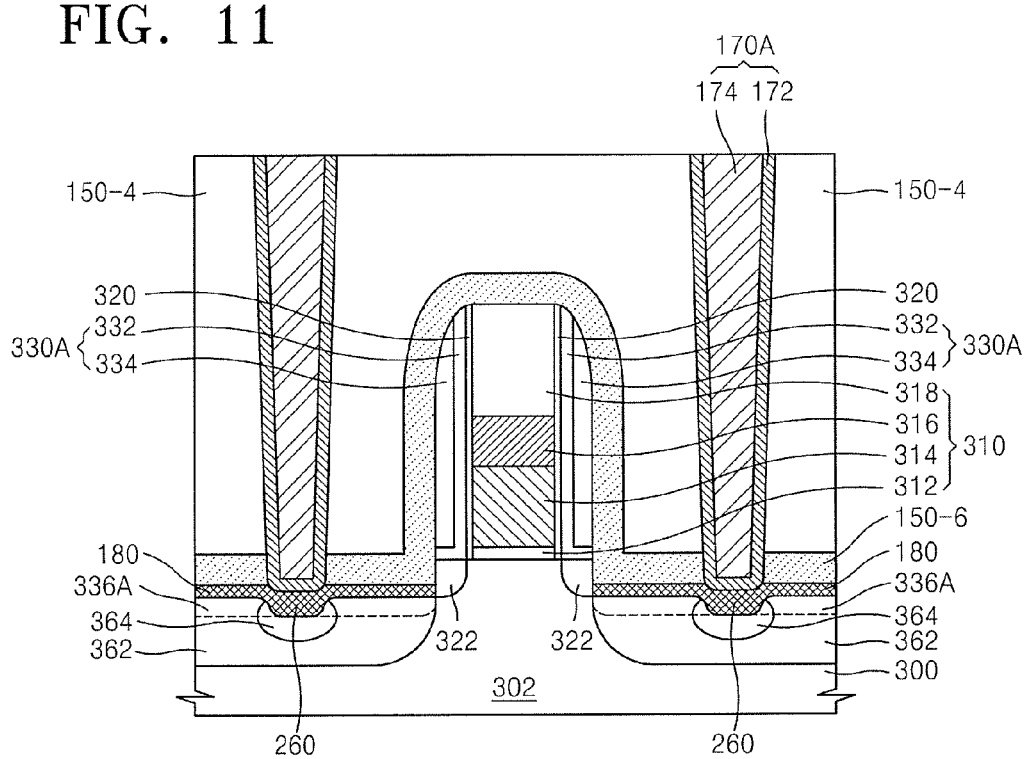
FIG. 11 is a FET fabricated according to an exemplary embodiment of the inventive concept.

FIG. 11 is a FET fabricated according to an exemplary embodiment of the inventive concept. In the FET of FIG. 11, the first metal silicide layer 260 is formed at the bottom of the vertical conductive plug 170A as in FIG. 2e, and the (second) horizontal (planar) metal silicide layer 180 does not extend under the FET's gate stack 310 as in FIG. 5c.

Figure 12:
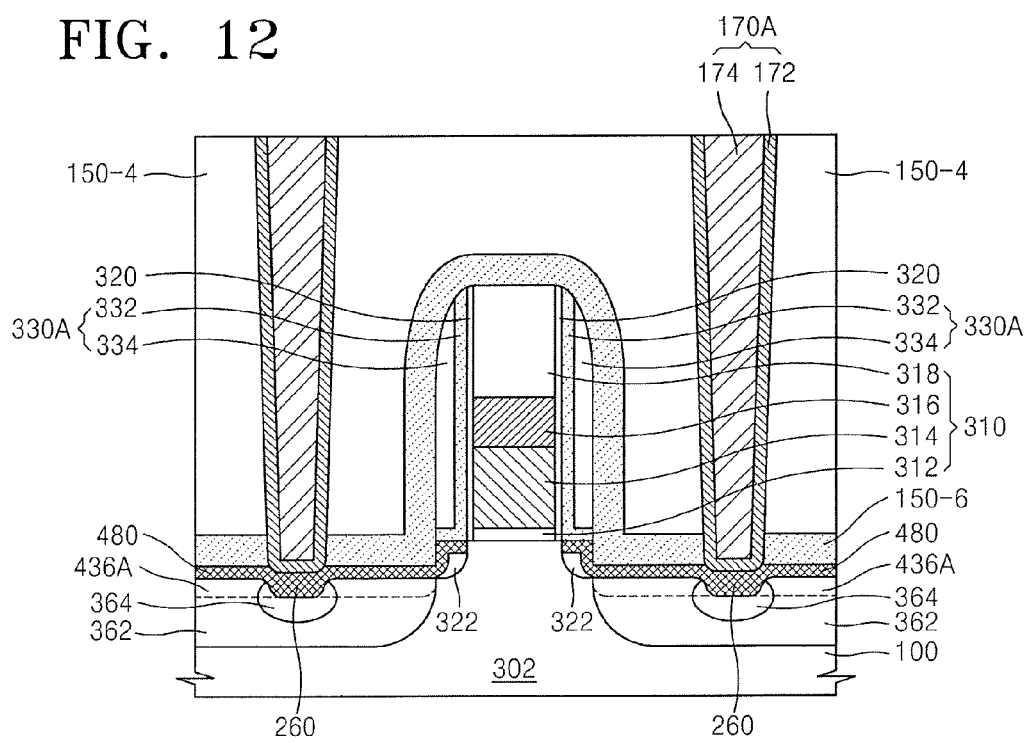
FIG. 12 is a FET fabricated according to an exemplary embodiment of the inventive concept.

FIG. 12 is a FET fabricated according to an exemplary embodiment of the inventive concept. In the FET of FIG. 12, the first metal silicide layer 260 is formed at the bottom of the vertical conductive plug 170A as in FIG. 2e, and the bi-level metal silicide layer 480 (180) is formed as in FIG. 6c.

Figure 13:
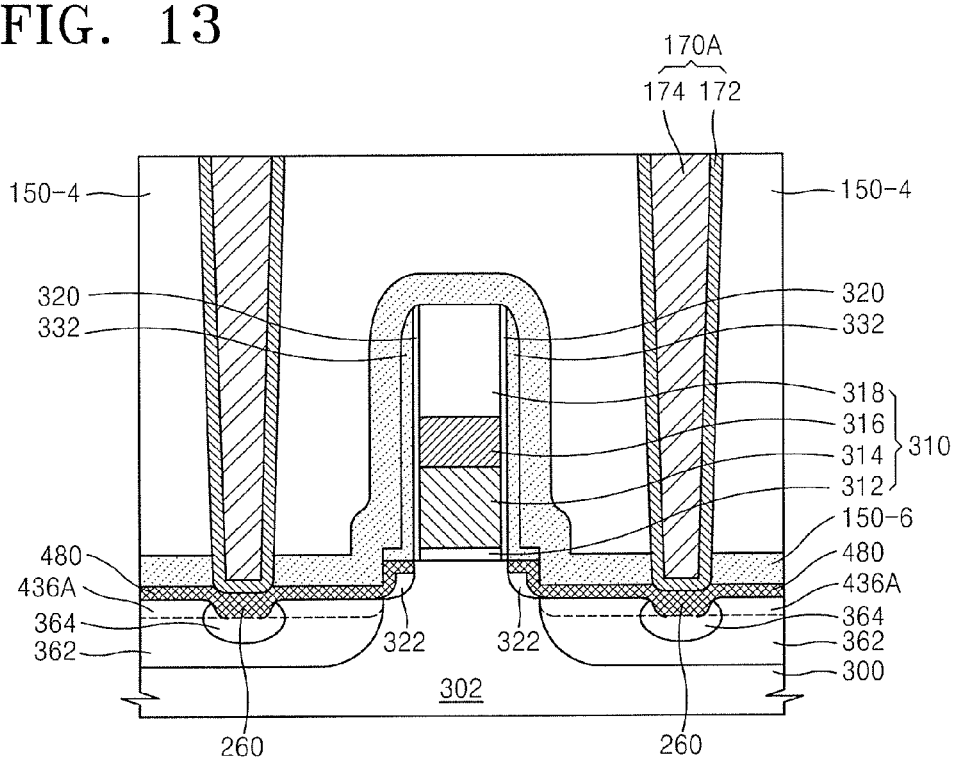
FIG. 13 is a FET fabricated according to an exemplary embodiment of the inventive concept.

FIG. 13 is a FET fabricated according to an exemplary embodiment of the inventive concept. In the FET of FIG. 13, the first metal silicide layer 260 is formed at the bottom of the vertical conductive plug 170A as in FIG. 2e, within the structure of the FIG. 7b including the second bi-level metal silicide layer 480 (180).

Figure 14:
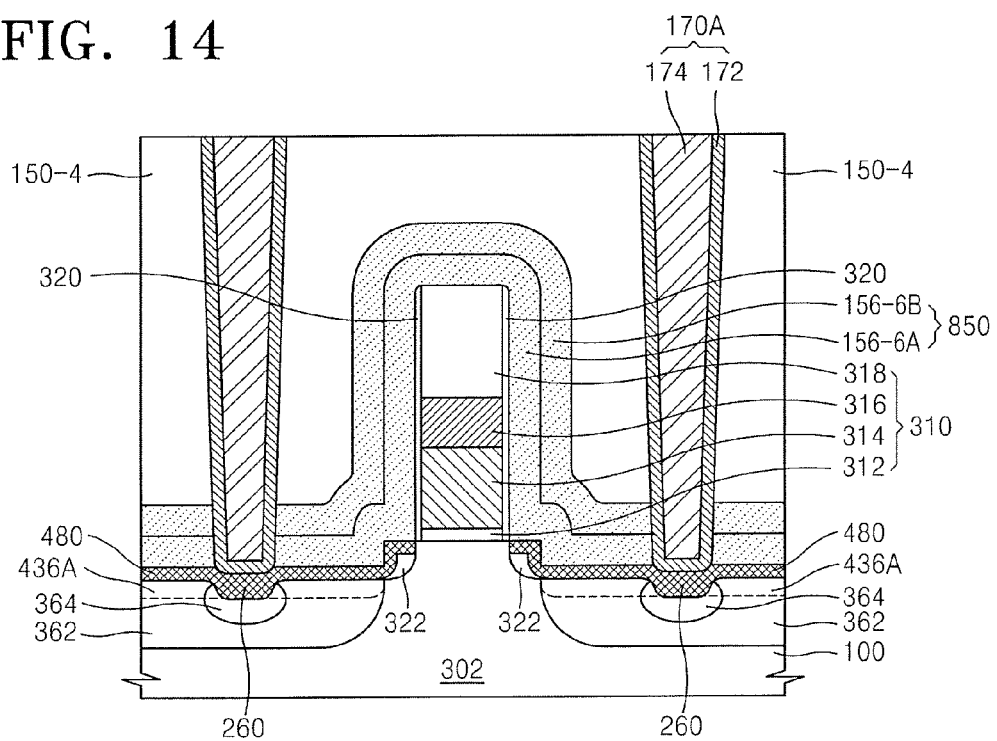
FIG. 14 is a FET fabricated according to an exemplary embodiment of the inventive concept.

FIG. 14 is a FET fabricated according to an exemplary embodiment of the inventive concept. In the FET of FIG. 14, the first metal silicide layer 260 is formed at the bottom of the vertical conductive plug 170A as in FIG. 2e, formed in the structure of FIG. 8f including the second bi-level metal silicide layer 480 (180).

FIG. 15a is a plan view of a memory cell region of DRAM device according to an exemplary embodiment of the inventive concept. FIG. 15b is a plan view of a core/peripheral region of the DRAM device of FIG. 15a. FIG. 15c is a cross sectional view along section line 15C1-15C1' of FIG. 15a and section line 15C2-15C2' in FIG. 15b.

The DRAM device includes a plurality of FETS each including a horizontal (planar) metal silicide layer 180. Each of the FETS may be a stack type transistor as depicted in FIGS. 1 through 14, or in alternative embodiments RCATs (recess channel array transistor). In the memory cell region, the DRAM device includes wordlines 1020 functioning as gate electrodes of the FETS used in DRAM memory cells, and bit lines 1030 electrically connected to self align contacts (SAC) 1024 through direct contacts (DC) 1026 formed within the interlayer dielectric layers 150-3, 150-2, 150-1 as shown in FIG. 15c.

Each FET includes at least one contact plug 170 and a metal silicide layer 180 as previously explained in the 1st through 14th embodiments. In the memory cell region, the contact plug 170 electrically connects the S/D region 1032 of a FET to a storage capacitor (not shown).

In the core/peripheral region, the FETs comprise a low voltage (LV) transistors and/or a high voltage (HV) transistors that each includes a gate electrode 1050, a contact plug 170 and a horizontal (planar) metal silicide layer 180 formed on the S/D region 1034 of the gate electrode as previously described. The metal silicide layer 180 may be formed under and surrounding the contact plug 170 in FIGS. 15a and 15b. The metal silicide layer 180 is formed by filling the horizontal vacancy that conforms to the bottom surface of the stress control layer 150-6 of the insulating layer 150 (150-1, 150-2, 150-3, 150-6) while the insulating layer 150 is structurally supported by the shallow trench isolation (STI) 1010 on one side, and by the FET's gate stack 1050 (310) on the other. The stress control layer 150-6 of the insulating layer 150 may not be formed in the cell region of the DRAM device, because of the difficulty forming the self align contact (SAC) 1024. Contact pads 1052 in the core/peripheral region enable the DRAM device to interface with outside circuits.

Figure 16:
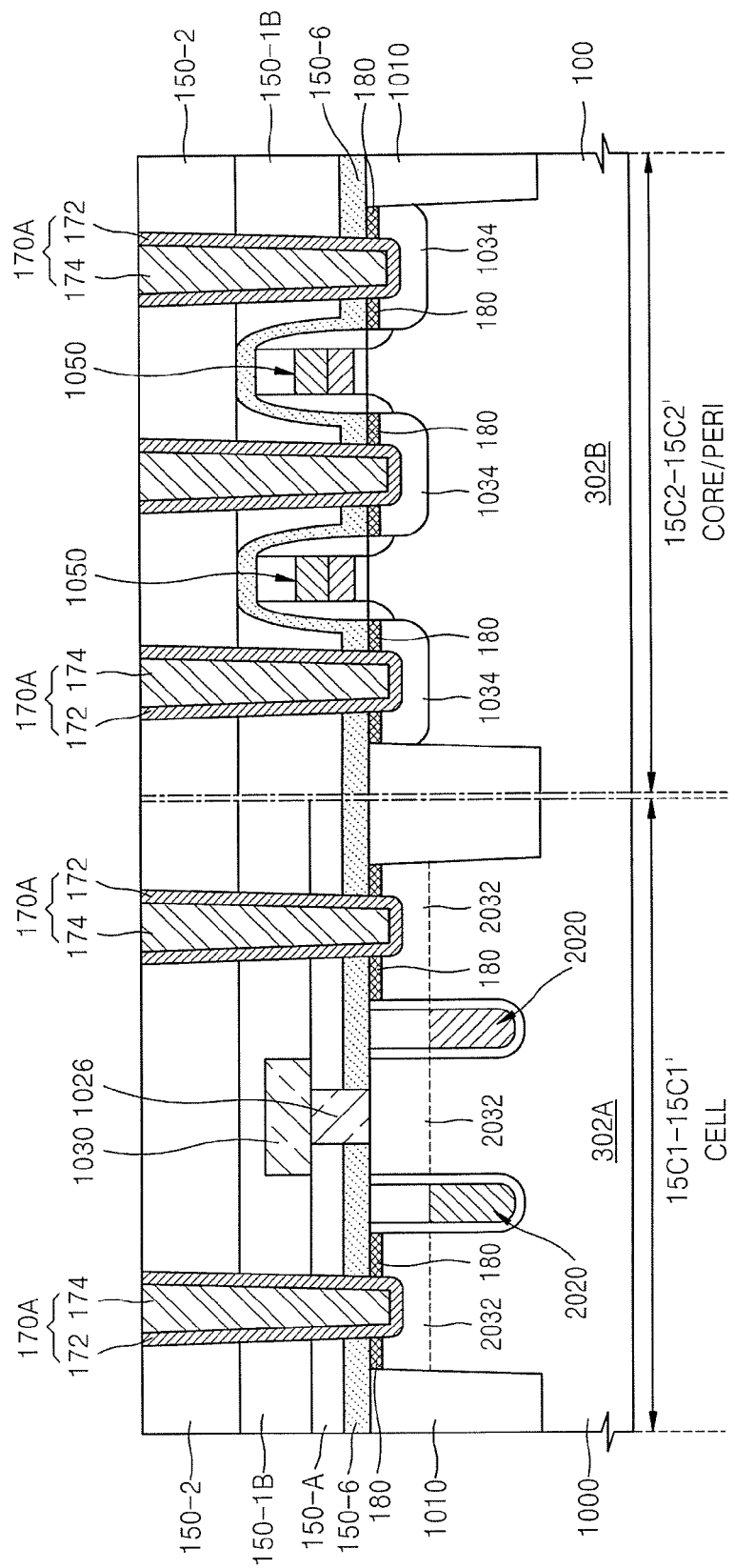
FIG. 16 is a cross sectional view of a DRAM device, along section line 15C1-15C1' of FIG. 15a and section line 15C2-15C2' in FIG. 15b, according to a exemplary embodiment of the inventive concept.

FIG. 16 is a cross sectional view of a DRAM device, along section line 15C1-15C1' of FIG. 15a and section line 15C2-15C2' in FIG. 15b, according to an exemplary embodiment of the inventive concept. The DRAM device of FIG. 16 is similar to that of FIG. 15c except that the word lines 2020 in the cell region 3020A are buried channel array transistor (BCAT) type buried word lines. The gate of the BCAT transistor is buried in a trench formed in a semiconductor substrate. Thus, the metal silicide layer 180 is formed by filling the horizontal vacancy that conforms to the bottom surface of the stress control layer 150-6 of the insulating layer 150 (150-1, 150-2, 150-3, 150-6) while the insulating layer 150 is structurally supported by the shallow trench isolation (STI) 1010 on one side, and by the FET's buried gates 2020 on the other.

Figure 17A:
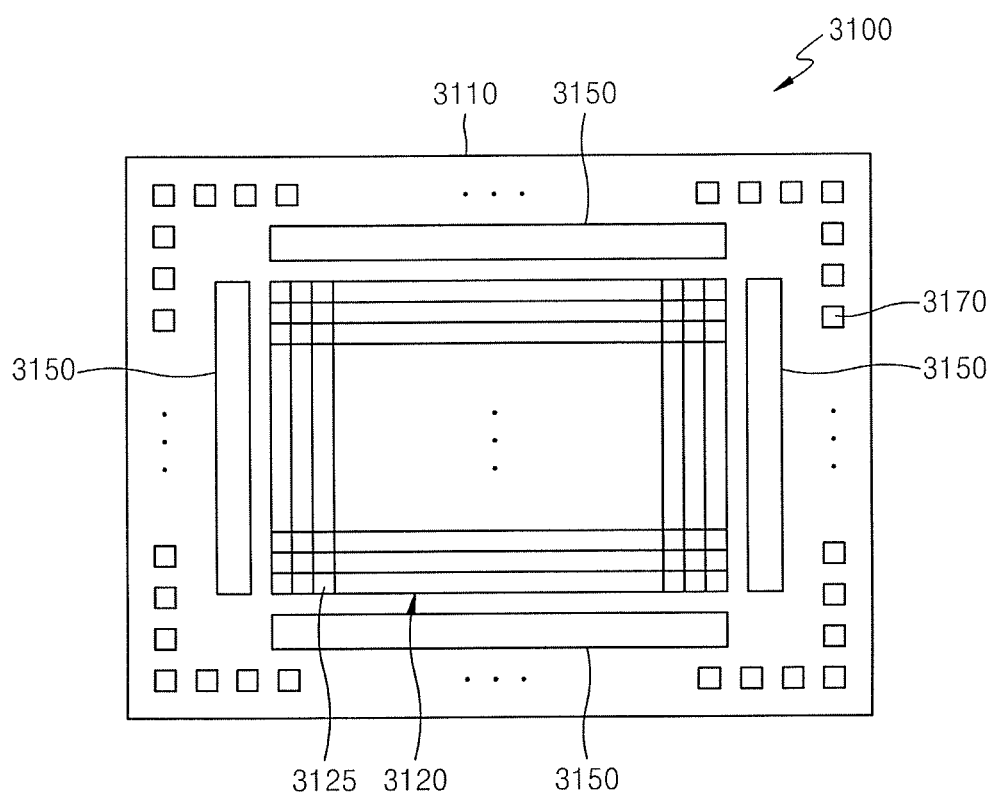
FIG. 17a is a block diagram of a CMOS image sensor 3100 having a metal silicide layer fabricated according to any embodiment of the present inventive concept.

FIG. 17a is a schematic block diagram of a CMOS image sensor 3100. The sensor 3100 comprises a pixel array region 3120 and a peripheral CMOS logic region 3150, formed on a circuit substrate 3110. The pixel array region 3120 comprises a plurality of pixels 3125 each of which comprises a photodiode, a transfer gate transistor (FET), a floating diffusion region, a reset gate, and a source follower transistor (amplifier), wherein at least the transfer gate FET includes a metal silicide layer 180 fabricated according to an embodiment of the inventive concept. The peripheral logic region 3150 comprises a plurality of field effect transistors (FETs) including a metal silicide layer 180 fabricated according to an embodiment of the inventive concept.

Figure 17B:
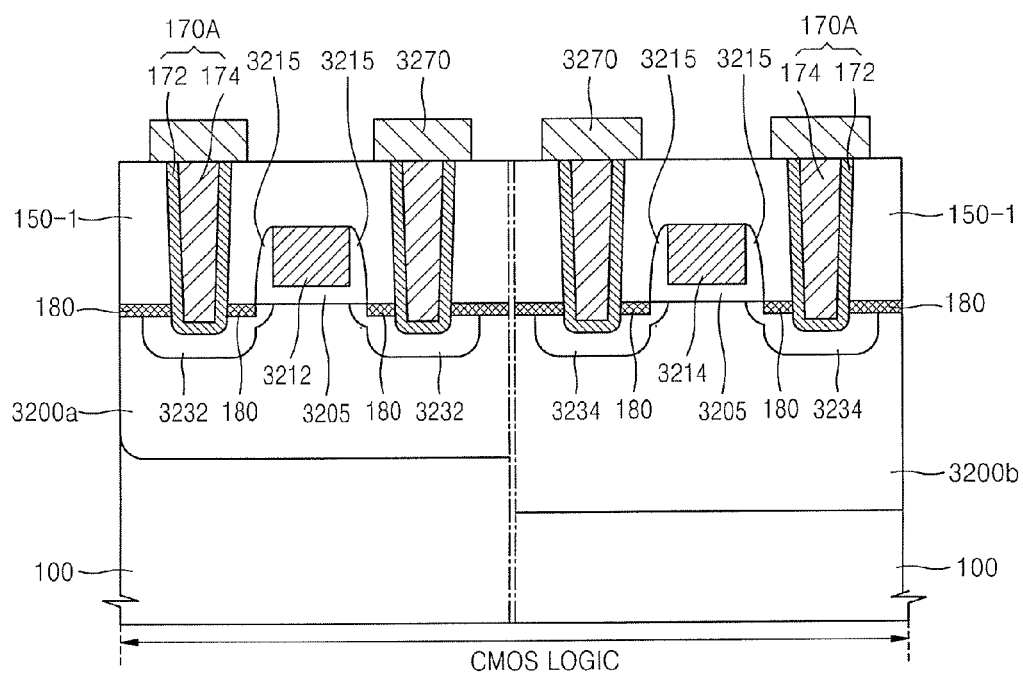

FIG. 17b is a cross sectional view of a n-type FET 3212 and a p-type FET 3214 formed in the peripheral logic region 3150 of the CMOS image sensor 3100 of FIG. 17a. The channel of the n-type FET 3212 is formed in P well 3200a between two S/D regions 3232, and the channel of the p-type FET 3214 is formed in the N well 3200b between two S/D regions 3234, both channels being formed in the semiconductor substrate 100. The gate 3212 of the NMOS FET is separated from its channel 3212 by a gate dielectric layer 3205, and the gate 3214 of the PMOS FET is separated from its channel 3214 by the gate dielectric layer 3205.

A contact plug 170 and a metal silicide layer 180 is formed on each of the S/D regions 3232, 3234 as previously explained in the first through 14th embodiments. Each contact plug 170 is formed in a contact hole formed through an interlayer dielectric layer 150-1 (first insulating layer 150). The FETs can be electrically connected to other elements of the CMOS image sensor, such as external pads 3170 (FIG. 17a) through a contact plug 170, and a metal interconnection (wire) 3270.

Figure 18:
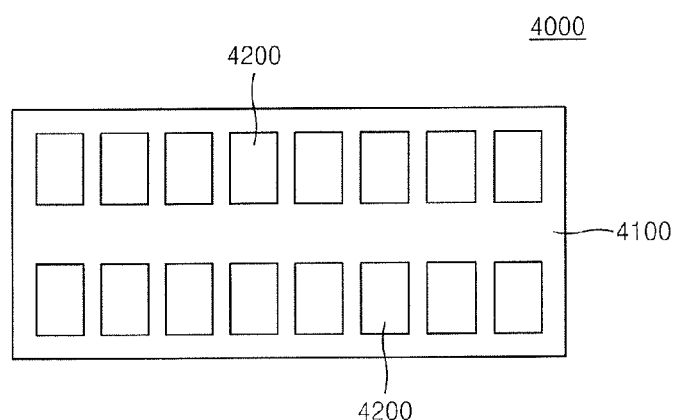
FIG. 18 is a plan view of a memory module 4000 comprising a FET including a metal silicide layer fabricated according to any embodiment of the present inventive concept.

FIG. 18 is a plan view of a memory module 4000 comprising a field effect transistor (FET) including a metal silicide layer fabricated according to any embodiment of the present inventive concept. The module 4000 comprises a printed circuit substrate 41000 and a plurality of chip packages 4200. Each chip package 4200 comprises a semiconductor device (e.g. FET) including a metal silicide layer 180 fabricated according to any of the above-described embodiments. Examples of the chip packages 4200 of the memory system including a metal silicide layer 180 according to embodiment of the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 19:
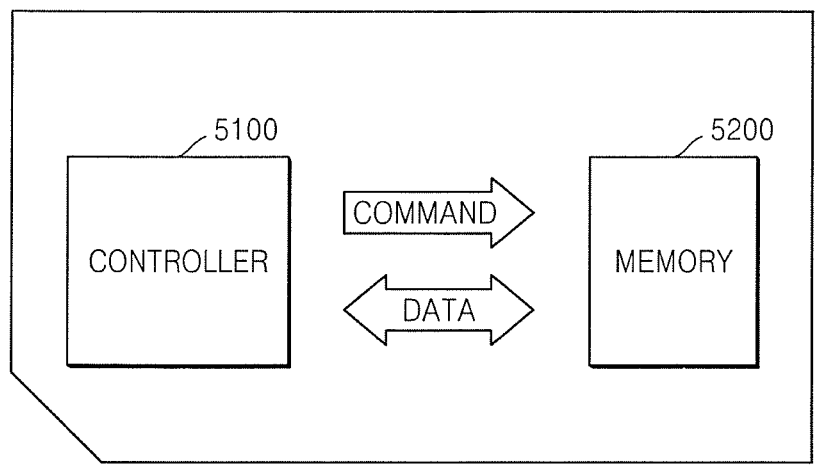
FIG. 19 is a block diagram of a nonvolatile memory device 5200 in a memory card 5000 comprising a FET which includes a metal silicide layer fabricated according to any exemplary embodiment of the present inventive concept.

FIG. 19 is a block diagram of a nonvolatile memory device comprising a field effect transistor (FET) including a metal silicide layer fabricated according to an exemplary embodiment of the inventive concept.

Referring to FIG. 19, a nonvolatile (e.g., NAND flash) memory card 5000 includes a memory cell array (not shown) within the memory device 5200 that includes a plurality of nonvolatile memory cells disposed at the intersections of a plurality of wordlines and a plurality of bit lines. Each of the nonvolatile memory cells includes a FET adapted to store data, and includes a metal silicide layer 180 fabricated according to any exemplary embodiment of the present inventive concept. The nonvolatile memory device 5200 further includes a control logic unit (not shown) in a peripheral region. The control logic unit perform erase/program/read/verify-read operations in the memory cell array according to control signals CTRL received from the memory controller 5100.

The memory controller 5100 is connected between a host and the NAND flash memory device 5200. The memory controller 5100 is configured to access the NAND flash memory device 5200 in response to the request of the host.

The memory controller 5100 includes a random access memory (RAM), a processing unit (microprocessor), a host interface, and a NAND flash interface, all of which may contain a FET including a metal silicide layer 180 fabricated according to any exemplary embodiment of the present inventive concept. The processing unit of the memory controller 5100 is configured to execute a firmware code for controlling the NAND flash memory device 5200. The host interface is configured to interface with the host through a standard card (e.g., MMC) protocol for data exchange between the host and the memory controller 5100.

The memory card 5000 may be implemented as a Multimedia Card (MMC), Secure Digital (SD), miniSD, microSD, Memory Stick, SmartMedia, and TransFlash Card. The memory controller host-interface circuit may implement a standardized interface protocol selected from: Universal Serial Bus (USB), Multimedia Card (MMC), Peripheral Component Interconnection (PCI), PCI-Express (PCI-E), Advanced Technology Attachment (ATA, Parallel-ATA, pATA), Serial-ATA (SATA), external SATA (eSATA), Small Computer Small Interface (SCSI), Enhanced Small Disk Interface (ESDI), and Integrated Drive Electronics (IDE). The memory card 5000 of FIG. 19 may be a solid state drive (SSD) in an alternative embodiment of the inventive concept.

An SSD includes a plurality of flash memory devices (e.g., packaged and mounted as in FIG. 18) and an SSD memory controller 5100. The standardized interface protocol of the SSD may be one of a Serial Advanced Technology Attachment (SATA) interface, a Parallel Advanced Technology Attachment (PATA) interface, and an External SATA (eSATA) interface.

Figure 20:
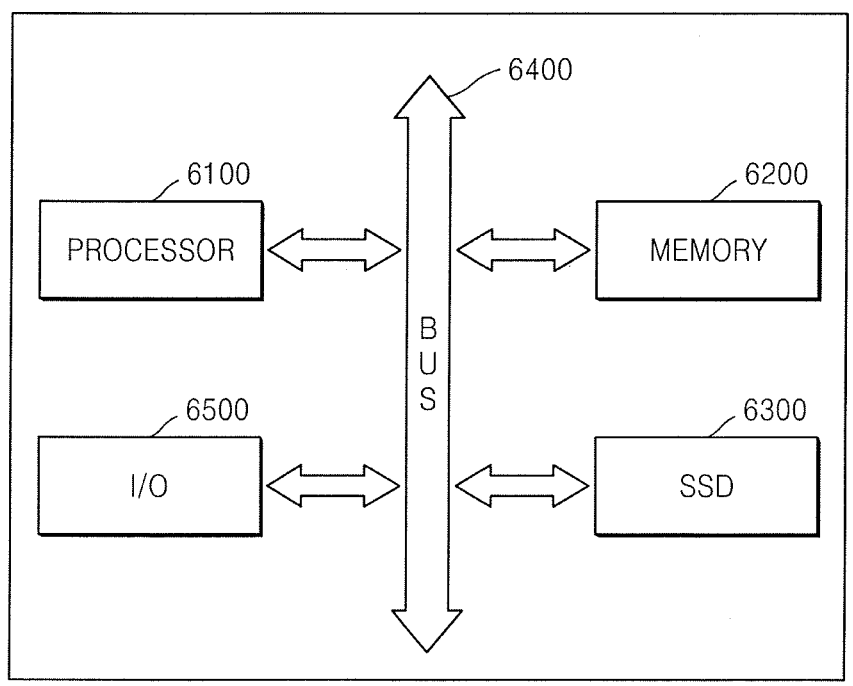
FIG. 20 is a block diagram of a computer system 6000 comprising a semiconductor device including a metal silicide layer fabricated according to any exemplary embodiment of the present inventive concept.

FIG. 20 is a block diagram of a computing system according to an exemplary embodiment of the inventive concept.

Referring to FIG. 20, the computing system 6000 includes a central processing unit (CPU) 6100, a ROM (not shown), a RAM 6200 (e.g. a DRAM) an input/output (I/O) device 6500, and a solid state drive (SSD) 6300 connected to a system bus 6400. The I/O device 6500 connected through an I/O device interface to the system bus. Examples of the I/O device 54 include keyboards, pointing devices (mouse), monitors, and modems, and may further include interfaces for mass storage devices (e.g., USB, Firewire, SATA, PATA, eSATA). The RAM 6200 may include the module 4000 of FIG. 18.

The ROM stores data and executable code used to operate the computing system 6000. Herein, the executable code may include a start command sequence or a basic I/O system (BIOS) sequence. The RAM 5200 temporarily stores the executable code and any data that are generated by the operation of the CPU 6100. The solid state drive SSD 6300 is a readable storage device and may be the same as the SSD 5000 of FIG. 19. At least one of the central processing unit (CPU) 6100, the ROM, the RAM 6200, the input/output (I/O) device 6500, and the solid state drive (SSD) 6300 includes a metal silicide layer 180 fabricated according to any embodiment of the inventive concept.

Examples of the computing system 6000 include personal computers, mainframe computers, laptop computes, cellular phones, personal digital assistants (PDAs), digital cameras, GPS units, digital TVs, camcorders, portable audio players (e.g., MP3), and portable media players (PMPs).

The above-disclosed subject matter is to be considered illustrative and not restrictive, and the appended claims are intended to cover all such modifications, variations, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device, comprising: device including a field effect transistor (FET), the device comprising: a substrate including a first portion having a first top surface, and a second portion having a second top surface, the second top surface being recessed below the first top surface; a gate stack disposed on a channel region in the first portion;
 a lightly doped drain junction region disposed underneath the gate stack and adjacent to a side thereof in the first portion;
 a crystallized silicon layer disposed in the second portion of the silicon substrate; a metal silicide layer disposed on the crystallized silicon layer, the metal silicide layer extending along the second top surface, contacting with the second top surface, and having an end portion contacting with the lightly doped drain junction region,;
 an insulating layer disposed on the metal silicide layer; and
 a plurality of contact plugs disposed substantially vertically through the insulating layer, the contact plugs having a metal barrier layer lining in the insulating layer and physically connecting with the metal silicide layer, wherein the contact plugs pass through an entire thickness of the metal silicide layer to contact ion implantation regions formed within a source region and a drain region of the substrate, and wherein the metal barrier layer lining of the contact plugs is filled with a conductive material.

2. The semiconductor device of claim 1, wherein the metal silicide layer has a thickness of from about 1 Å to 100 Å.

3. The semiconductor device of claim 1, further comprising a stress control layer disposed directly on the metal-silicide layer.

4. The semiconductor device of claim 3, wherein the contact plugs pass through an entire thickness of the stress control layer.

5. The semiconductor device of claim 3, wherein the stress control layer covers an entire top surface of the metal silicide layer.

6. The semiconductor device of claim 3, further comprising an insulating spacer interposed between the gate stack and the stress control layer, the insulating spacer disposed on the lightly doped drain junction region.

7. The semiconductor device of claim 1, wherein the metal barrier layer and the metal of the metal silicide layer both comprise at least one metal selected from titanium (Ti), tungsten (W), cobalt (Co), nickel (Ni), hafnium (Hf), platinum (Pt), and tantalum (Ta).

8. The semiconductor device of claim 1, wherein the metal barrier layer and the metal silicide layer include the same metal.

9. The semiconductor device of claim 1, wherein the substrate is planar, and wherein the contact plugs are formed perpendicular to and intersect the plane of the metal silicide layer.

* * * * *